US008521497B2

(12) United States Patent
Gering

(10) Patent No.: US 8,521,497 B2
(45) Date of Patent: Aug. 27, 2013

(54) SYSTEMS, METHODS AND COMPUTER-READABLE MEDIA FOR MODELING CELL PERFORMANCE FADE OF RECHARGEABLE ELECTROCHEMICAL DEVICES

(75) Inventor: Kevin L. Gering, Idaho Falls, ID (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 672 days.

(21) Appl. No.: 12/793,224

(22) Filed: Jun. 3, 2010

(65) Prior Publication Data

US 2011/0301931 A1 Dec. 8, 2011

(51) Int. Cl.
G06F 17/50 (2006.01)
(52) U.S. Cl.
USPC .......................................................... 703/13
(58) Field of Classification Search
CPC .................................................. G06F 17/5022
USPC .............................. 703/13; 702/63; 320/139
See application file for complete search history.

(56) References Cited

U.S. PATENT DOCUMENTS

| | | | |
|---|---|---|---|
| 5,872,443 A * | 2/1999 | Williamson ................... | 320/160 |
| 6,480,003 B1 | 11/2002 | Ugaji et al. | |
| 7,147,071 B2 | 12/2006 | Gering et al. | |
| 7,315,789 B2 | 1/2008 | Plett | |
| 7,400,149 B2 | 7/2008 | Koster et al. | |
| 7,582,387 B2 | 9/2009 | Howard et al. | |
| 8,191,618 B2 | 6/2012 | Gering et al. | |
| 2001/0009371 A1 | 7/2001 | Podrazhansky et al. | |
| 2001/0022518 A1 | 9/2001 | Asakura et al. | |
| 2003/0022032 A1 | 1/2003 | Miller et al. | |
| 2004/0220758 A1 | 11/2004 | Barsoukov et al. | |
| 2006/0181953 A1 | 8/2006 | Rotenberg et al. | |
| 2006/0186890 A1 | 8/2006 | Iwane et al. | |
| 2006/0284617 A1 | 12/2006 | Kozlowski et al. | |

(Continued)

FOREIGN PATENT DOCUMENTS

| WO | 2008/154956 A1 | 12/2008 |
|---|---|---|
| WO | WO 2009/091407 A2 | 7/2009 |

OTHER PUBLICATIONS

Parthasarathy M. Gomadam, John W. Weidner, Roger A. Dougal, Ralph E. White, Mathematical modeling of lithium-ion and nickel battery systems, Journal of Power Sources, vol. 110, Issue 2, Aug. 22, 2002, pp. 267-284, ISSN 0378-7753.*

(Continued)

Primary Examiner — Kamini S Shah
Assistant Examiner — Luke Osborne
(74) Attorney, Agent, or Firm — TraskBritt

(57) ABSTRACT

A system includes an electrochemical cell, monitoring hardware, and a computing system. The monitoring hardware periodically samples performance characteristics of the electrochemical cell. The computing system determines cell information from the performance characteristics of the electrochemical cell. The computing system also develops a mechanistic level model of the electrochemical cell to determine performance fade characteristics of the electrochemical cell and analyzing the mechanistic level model to estimate performance fade characteristics over aging of a similar electrochemical cell. The mechanistic level model uses first constant-current pulses applied to the electrochemical cell at a first aging period and at three or more current values bracketing a first exchange current density. The mechanistic level model also is based on second constant-current pulses applied to the electrochemical cell at a second aging period and at three or more current values bracketing the second exchange current density.

35 Claims, 9 Drawing Sheets

(56) References Cited

U.S. PATENT DOCUMENTS

| | | | |
|---|---|---|---|
| 2006/0284619 | A1 | 12/2006 | Quint et al. |
| 2007/0090844 | A1 | 4/2007 | Klang |
| 2007/0112475 | A1 | 5/2007 | Koebler et al. |
| 2007/0252601 | A1 | 11/2007 | Satoh et al. |
| 2008/0154956 | A1 | 6/2008 | DeBie |
| 2009/0106970 | A1 | 4/2009 | Fan et al. |
| 2009/0157369 | A1 | 6/2009 | Li et al. |
| 2010/0021776 | A1 | 1/2010 | Dougherty et al. |
| 2010/0023307 | A1 | 1/2010 | Lee et al. |
| 2010/0033132 | A1* | 2/2010 | Nishi et al. .......... 320/136 |
| 2011/0054816 | A1 | 3/2011 | Prada et al. |
| 2011/0060565 | A1 | 3/2011 | Sciarretta et al. |
| 2011/0077880 | A1 | 3/2011 | Gering |
| 2011/0264381 | A1 | 10/2011 | Gering |
| 2011/0288797 | A1 | 11/2011 | Schmidt |

OTHER PUBLICATIONS

Pankaj Arora et al., Capacity Fade Mechanisms and Side Reactions in Lithium-Ion Batteries, J. Electrochem. Soc. 1998 vol. 145, issue 10, pp. 3647-3667.*

PCT International Search Report and Written Opinion of the International Searching Authority for PCT/US2011/038078, dated Sep. 9, 2011, 9 pages.

Gering, Kevin L., "Kinetic Performance of Li-ion cells during Short Pulses, with Emphasis on Low Temperature Behavior," Idaho National Laboratory, 2008, Retrieved from the Internet: <URL: http://web.archive.org/web/20081207132503/http://www.electrochem.org/meetings/scheduler/abstracts/214/1288.pdf> p. 1.

Ratnakumar et al., "Lithium-Ion Rechargeable Batteries on Mars Rover," 2nd International Energy Conversion Engineering Conference, 2004, Retrieved from the Internet: <URL: http://trs-new.jpl.nasa.gov/dspace/handle/2014/38818> pp. 1-8.

PCT International Search Report and Written Opinion of the International Searching Authority for PCT/US2011/030862, dated Jun. 21, 2011, 12 pages.

Domenico et al., "Lithium-Ion battery state of charge estimation with a Kalman Filter based on a electrochemical model," 2008, IEEE, pp. 702-707.

Christophersen et al., "Advanced Technology Development Program for Lithium-Ion Batteries: Gen 2 Performance Evaluation Final Report," Idaho National Laboratory, Jul. 2006. [retrieved on 2010-20-21] Retrieved from the internet: <URL: http://www.inl.gov/technical/publications/Documents/3395031.pdf>, 140 pages.

PCT International Search Report and Written Opinion of the International Searching Authority for PCT/US2010/048708, dated Nov. 9, 2010, 9 pages.

Gering et al. "Evaluation of Performance Change in Lithium-ion Cells Using a Multiple Sigmoid Model", 2003, The Electrochemical Society, Inc., 1 page.

Ding et al., "Diminution of Supercooling of Electrolytes by Carbon Particles," J. Electrochem. Soc., vol. 146 (11), pp. 3974-3980, (1999).

Santana et al., "Electrochemical characterization and oxygen evolution at a heavily boron doped diamond electrode," Electrochem. Acta, vol. 50, pp. 2017-2027 (2005).

Wang et al., "Feasibility study for reductive destruction of carbon tetrachloride using bare and polymer coated nickel electrodes," J. Appl. Electrochemistry, vol. 35, pp. 243-248 (2005).

PCT International Search Report and Written Opinion of the International Searching Authority for PCT/US2012/059394, dated Jun. 20, 2013, 11 pages.

* cited by examiner

SYSTEMS, METHODS AND COMPUTER-READABLE MEDIA FOR MODELING CELL PERFORMANCE FADE OF RECHARGEABLE ELECTROCHEMICAL DEVICES

GOVERNMENT RIGHTS

This invention was made with government support under Contract Number DE-AC07-05ID14517 awarded by the United States Department of Energy. The government has certain rights in the invention.

CROSS-REFERENCE TO RELATED APPLICATIONS

This application is related to:

U.S. patent application Ser. No. 12/571,253 filed Sep. 30, 2009, now U.S. Pat. No. 8,467,984, issued Jun. 18, 2013, and entitled "Systems, Methods and Computer Readable Media for Estimating Capacity Loss in Rechargeable Electrochemical Cells" and U.S. patent application Ser. No. 12/765,384 filed Apr. 22, 2010, now U.S. Pat. No. 8,346,495, issued Jan. 1, 2013, and entitled "Systems, Methods and Computer-Readable Media to Model Kinetic Performance of Rechargeable Electrochemical Devices."

The disclosure of each of the foregoing documents is hereby incorporated by reference in its entirety.

TECHNICAL FIELD

The present invention relates generally to the field of batteries. Specifically, embodiments of the present invention relate to analysis of rechargeable electrochemical cells.

BACKGROUND

A battery converts stored chemical energy to electrical energy, which may be conveyed as a voltage potential. As a battery ages its storage capacity and conductance will decrease (i.e., fade) between a Beginning Of Life (BOL) and an End Of Life (EOL). Therefore, observations of battery parameters such as cycle rate (magnitude of current), cumulative cycling time, and storage capacity may be helpful in determining an overall State Of Health (SOH) of a battery over its service life.

In many contemporary battery systems such as lithium-ion (Li-ion), performance limitations at the cell level often relate to the effective rate or kinetics of the charge transfer reaction that occurs at either electrode surface. In terms of general electrochemistry for reversible systems, the electron-accepting charge transfer reaction occurs at the cathode surface during cell discharge, and occurs at the anode surface during cell charge. This overall process becomes more problematic for Li-ion cells having porous heterogeneous electrode materials that are typically covered by passivation films collectively known as the solid electrolyte interphase (SEI). Performance limitations during a cell pulse are then due to sluggish kinetics and are generally manifest by large impedance-driven voltage shifts and reduced power capabilities.

Cell conductance is defined herein as the inverse of cell impedance, where conductance limitations are directly related to a particular cell chemistry (choice of cell materials, their dimensions, and configuration within a cell) and can be more severe under specific operational conditions (for example, low temperature and low State-Of-Charge (SOC)) and at advanced aging of a cell, making it more difficult to accurately model cell conductance for new battery chemistries using classical theories developed several decades ago.

There is a need for systems and methods that provide a modeling capability that more accurately determines, tracks, diagnoses, and predicts conductance characteristics in electrochemical cells and batteries formed therefrom.

BRIEF SUMMARY OF THE INVENTION

Embodiments of the present invention provide a modeling capability that more accurately determines, tracks, diagnoses, and predicts cell conductance characteristics in electrochemical cells and batteries formed therefrom, considering particular conditions under which a cell is operated in direct current (DC) mode.

An embodiment of the present invention comprises a method wherein at least one act of the method is performed by a processor, the method includes developing a mechanistic level model of an electrochemical cell to determine performance fade characteristics of the electrochemical cell and analyzing the mechanistic level model to estimate performance fade characteristics over aging of a similar electrochemical cell. The mechanistic level model uses first constant-current pulses applied to the electrochemical cell at a first aging period and at three or more current values bracketing a first exchange current density. The mechanistic level model also uses second constant-current pulses applied to the electrochemical cell at a second aging period and at three or more current values bracketing the second exchange current density.

Another embodiment of the present invention comprises a method that includes developing a mechanistic level model of an electrochemical cell to determine performance fade characteristics of the electrochemical cell and analyzing the mechanistic level model to estimate performance fade characteristics over aging of a similar electrochemical cell. At least one of a discharge process for, a charge process for, and composition of, the electrochemical cell is modified responsive to the analysis of the mechanistic level model. The mechanistic level model uses first constant-current pulses applied to the electrochemical cell at a first aging period and at three or more current values bracketing a first exchange current density. The mechanistic level model also uses second constant-current pulses applied to the electrochemical cell at a second aging period and at three or more current values bracketing the second exchange current density.

Another embodiment of the present invention comprises a system including an electrochemical cell, monitoring hardware, and a computing system. The monitoring hardware is operably coupled to the at least one electrochemical cell and is configured for sampling cell characteristics of the electrochemical cell. The computing system is operably coupled to the monitoring hardware and is configured for developing a mechanistic level model of an electrochemical cell to determine performance fade characteristics of the electrochemical cell based using the sampled cell characteristics and analyzing the mechanistic level model to estimate performance fade characteristics over aging of a similar electrochemical cell. The mechanistic level model uses first constant-current pulses applied to the electrochemical cell at a first aging period and at three or more current values bracketing a first exchange current density. The mechanistic level model uses second constant-current pulses applied to the electrochemical cell at a second aging period and at three or more current values bracketing the second exchange current density.

Another embodiment of the present invention comprises a computer-readable medium including computer-executable instructions, which when executed on one or more processors, cause the processors to develop a mechanistic level model of an electrochemical cell to determine performance fade characteristics of the electrochemical cell and analyze the mechanistic level model to estimate performance fade characteristics over aging of a similar electrochemical cell. The mechanistic level model uses first constant-current pulses applied to the electrochemical cell at a first aging period and at three or more current values bracketing a first exchange current density. The mechanistic level model also uses second constant-current pulses applied to the electrochemical cell at a second aging period and at three or more current values bracketing the second exchange current density.

BRIEF DESCRIPTION OF THE DRAWINGS

While the specification concludes with claims particularly pointing out and distinctly claiming that which is regarded as the present invention, the advantages of this invention may be more readily ascertained from the following description of the invention when read in conjunction with the accompanying drawings, in which:

DETAILED DESCRIPTION OF THE INVENTION

Figure 1:
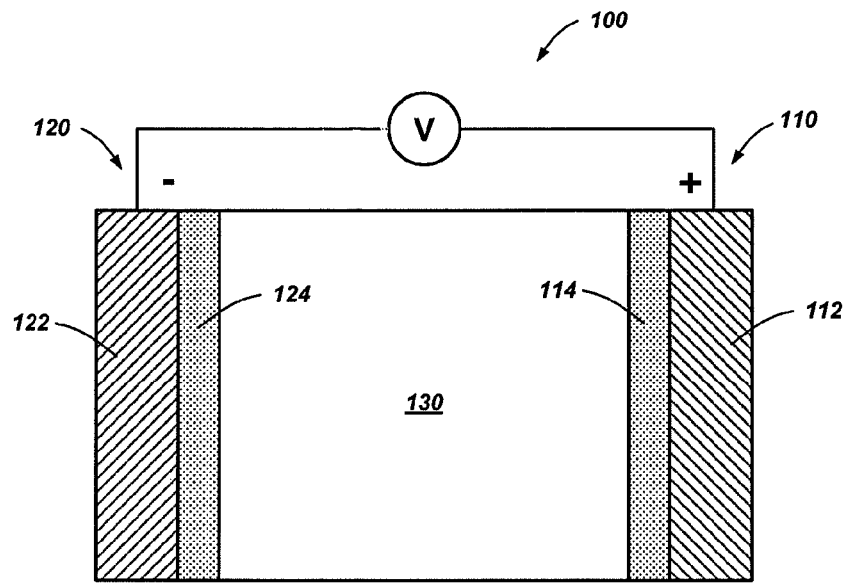
FIG. 1 is a simplified diagram of a rechargeable electrochemical cell.

In the following description, elements, circuits, and functions may be shown in block diagram form in order not to obscure the present invention in unnecessary detail. Conversely, specific implementations shown and described are exemplary only and should not be construed as the only way to implement the present invention unless specified otherwise herein. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

Furthermore, in this description of embodiments of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. The following detailed description is not to be taken in a limiting sense, and the scope of the present invention is defined only by the appended claims.

Those of skill in the art would understand that information and signals may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal.

Those of skill would further appreciate that the various illustrative logical blocks, modules, circuits, and algorithm acts described in connection with embodiments disclosed herein may be implemented as electronic hardware, computer software, or combinations of both. To clearly illustrate this interchangeability of hardware and software, various illustrative components, blocks, modules, circuits, and steps are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments of the invention described herein.

The various illustrative logical blocks, modules, and circuits described in connection with the embodiments disclosed herein may be implemented or performed with a general purpose processor, a special purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Also, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a function, a procedure, a subroutine, a subprogram, etc. Furthermore, the methods disclosed herein may be implemented in hardware, software, or both. If implemented in software, the functions may be stored or transmitted as one or more instructions or code on a computer-readable medium. Computer-readable media includes both computer storage media and communication media including any medium that facilitates transfer of a computer program from one place to another.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

Headings are included herein to aid in locating certain sections of detailed description. These headings should not be considered to limit the scope of the concepts described under any specific heading. Furthermore, concepts described in any specific heading are generally applicable in other sections throughout the entire specification.

The terms "mechanistic level diagnostics" and "mechanistic level models," as used herein, mean a diagnostics process for electrochemical cells and a modeling process for electrochemical cells that are based on analysis and modeling of physical characteristics of the electrochemical cells. These physical-characteristics-based processes are different from processes that use empirical testing of the electrochemical cells and simply develop curves that fit the empirical data. However, that is not to say that development of the mechanistic level processes is necessarily completely devoid of empirical data. Empirical information may be used to verify that mechanistic level processes are properly modeling physical characteristics of the electrochemical cells and, in some cases, empirical information may be used to train and refine the mechanistic level processes.

Embodiments of the present invention provide a modeling capability that more accurately determines, tracks, diagnoses, and predicts cell conductance characteristics in electrochemical cells and batteries formed therefrom, considering particular conditions under which a cell is operated in direct current (DC) mode.

1. Hardware Environment

Much of the description herein concentrates on lithium-ion cells. However, embodiments of the present invention are not so limited and may be applicable to other types of electrochemical cells and other systems that degrade over time due to mechanisms that may be accurately modeled. Additionally, embodiments of the present invention may be applicable to connected assemblies of cells (modules, packs) and connected assemblies of other systems that degrade over time.

FIG. 1 is a simplified diagram of a rechargeable lithium-ion electrochemical cell 100. A typical lithium-ion cell 100 includes three primary functional components, a cathode 110, an anode 120, and electrolyte 130. The electrochemical cell 100 may also include a separator (e.g., a polymeric microporous material, not shown) provided between the cathode 110 and the anode 120, also referred to herein as negative and positive electrodes 120, 110, respectively. A battery may include one or more electrochemical cells 100 to form a current and voltage capability based on the application for which it is used.

The cathode 110 includes a positive current collector 112 and a positive active material 114. The anode 120 includes a negative current collector 122 and a negative active material 124. In the context of Li-ion cells, both the positive active material 114 and the negative active material 124 are materials into which and from which lithium ions can migrate, that is, the cathode 110 receives lithium ions from the anode 120 during the discharge process, and stores such until the process is reversed under the charge process, wherein lithium ions are passed from cathode 110 to anode 120. The movement of lithium ions into the active materials (114, 124) is often referred to as "intercalation" or "insertion" and the movement of lithium ions out of the active materials (114, 124) is referred to as "deintercalation" or "extraction."

The negative active material 124 may be a carbonaceous material such as graphite. The positive active material 114 may be a material, such as, for example, lithium cobalt oxide, lithium iron phosphate, or lithium manganese oxide. The positive current collector 112 and negative current collector 122 may be a material such as aluminum, copper, or other suitable electrically conductive material. The electrolyte 130 is typically an organic electrolyte that acts as an ionic path between electrodes 110 and 120.

The electrodes (110, 120) may be provided as relatively flat or planar plates or may be wrapped or wound in a spiral or other configuration (e.g., an oval configuration). The electrodes (110, 120) may also be provided in a folded configuration.

During charging and discharging of the electrochemical cell 100, lithium ions move through the electrolyte 130 between the positive electrode 110 and the negative electrode 120. For example, when the electrochemical cell 100 is discharging, lithium ions flow from the negative electrode 120 to the positive electrode 110. Conversely, when the electrochemical cell 100 is charging, lithium ions flow from the positive electrode 110 to the negative electrode 120.

A passivating layer, also referred to herein as solid electrolyte interphase (SEI), may develop between an electrode (110, 120) and the electrolyte 130 from the reductive or oxidative decompositions of a small amount of organic electrolytes mostly during the first several cycles of a working cell.

Figure 2:
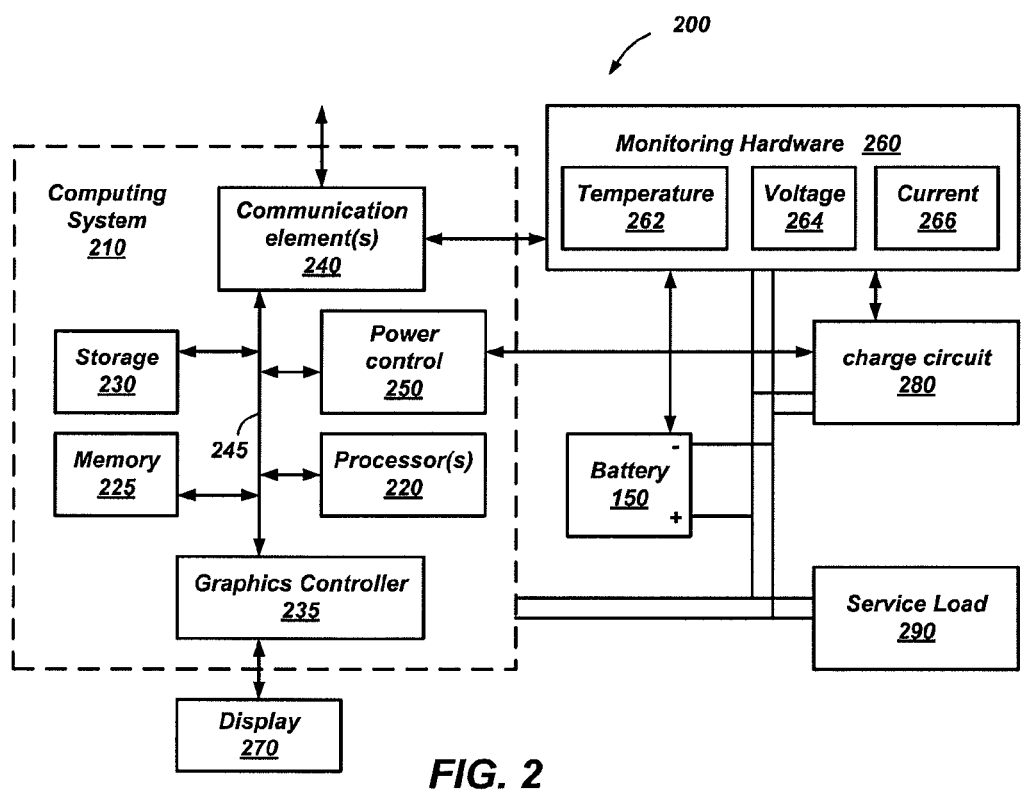
FIG. 2 is a simplified diagram of a system for analyzing, controlling, using, or a combination thereof, an electrochemical cell.

FIG. 2 is a simplified diagram of a system 200 for analyzing, monitoring, and controlling a battery 150. A computing system 210 is configured for executing software programs containing computing instructions and includes one or more processors 220, memory 225, one or more communication elements 240, and storage 230.

The one or more processors 220 may be configured for executing a wide variety of operating systems and applications including the computing instructions for carrying out embodiments of the present invention.

The memory 225 may be used to hold computing instructions, data, and other information for performing a wide variety of tasks including performing embodiments of the present invention. By way of example, and not limitation, the memory 225 may include Synchronous Random Access Memory (SRAM), Dynamic RAM (DRAM), Read-Only Memory (ROM), Flash memory, and the like.

The communication elements 240 may be configured for communicating with other devices or communication networks (not shown). As non-limiting examples, the communication elements 240 may interface with external hardware and software (e.g., for cell or battery charging through an external device or grid) or for downloading stored data to an external data logger, or computer. By way of example, and not limitation, the communication elements 240 may include elements for communicating on wired and wireless communication media, such as for example, serial ports, parallel ports, Ethernet connections, universal serial bus (USB) connections IEEE 1394 ("firewire") connections, BLUETOOTH® wireless connections, 802.1 a/b/g/n type wireless connections, and other suitable communication interfaces and protocols.

The storage 230 may be used for storing large amounts of non-volatile information for use in the computing system 210 and may be configured as one or more storage devices. By way of example, and not limitation, these storage devices may be, but are not limited to, magnetic and optical storage devices such as disk drives, magnetic tapes, CDs (compact disks), DVDs (digital versatile discs or digital video discs), and other equivalent storage devices.

When executed as firmware or software, the instructions for performing the processes described herein may be stored on a computer-readable medium. A computer-readable medium includes, but is not limited to, magnetic and optical storage devices such as disk drives, magnetic tape, CDs (compact disks), DVDs (digital versatile discs or digital video discs), and semiconductor devices such as RAM, DRAM, ROM, EPROM, and Flash memory.

By way of non-limiting example, computing instructions for performing the processes may be held on the storage 230, transferred to the memory 225 for execution, and executed by the processor 220. The processor 220, when executing computing instructions configured for performing the processes, constitutes structure for performing the processes. In addition, some or all portions of the processes may be performed by hardware specifically configured for carrying out the processes.

The storage 230 and memory 225 are coupled to the processor 220 such that the processor 220 can read information from, and write information thereto. In the alternative, the storage medium may be integral to the processor. Furthermore, the processor 230, memory 225 and storage 230 may reside, in various combinations, in an ASIC or FPGA.

A graphics controller 235 is coupled to the processor 220 and to a display 270, which may present information about the battery 150 and the processes described herein in the form of pictures, text, tables, graphs, and the like.

The elements of the computing system 210 are illustrated, for simplicity, as communicating across a bus 245. However, those of ordinary skill in the art will recognize that the computing system may include many different buses for communication between the various elements.

Monitoring hardware 260 may be included in the system 200 for monitoring various cell characteristics, functions, and status of the battery 150. As is known in the art, a voltage monitor 264 and a current monitor 266 may be coupled to the battery 150 to monitor operational power characteristics of the battery 150. A temperature monitor 262 may be included to monitor overall temperature of the battery 150, temperature of individual cells in the battery 150, and combinations thereof. A timing monitor (not shown) may be included as monitoring hardware 260 or may be performed by the computing system 210. The timing monitor may track cycling of the battery 150 including times associated with charging and discharging the battery 150. The monitoring hardware 260 may be controlled and queried by the computing system 210 through general purpose or dedicated communication channels from the communication elements 240.

A charge circuit 280 may be included to control charging and possibly discharging of the battery 150. The charge circuit 280 may provide information related to timing and electrical power characteristics of the battery 150 to the monitoring hardware 260. The charge circuit may be controlled by a dedicated power control module 250 on the computing system 210. Alternatively, the computing system 210 may control the charge circuit 280 through general purpose or dedicated communication channels from the communication elements 240.

A service load 290 generally represents other elements (not shown) within the system 200 that may draw power from the battery 150.

Functionally, the processes described herein may be considered to be controlled by a diagnostic center software process. The software process may include test protocols defined for cell interrogation using elements for data acquisition of cell characteristics such as current, voltage, and temperature over time and charge cycling. Diagnostic analysis algorithms may be defined as discussed below. Data regression algorithms may be implemented to define and refine various models and model parameters. Software modules may be included to store data in various raw and processed forms as may be needed by other processes and a data logger may be included to collect and store a performance history of the battery 150.

Thus, the system 200 may be configured to periodically sample cell characteristics of an electrochemical cell (e.g., a battery 150) and determine electrochemical cell information from the sampled characteristics. From the electrochemical cell information conductance characteristics of the battery 150 may be determined and incorporated into one or more models of battery performance.

2. Cell Conductance Analysis

For more effective, economical, and reliable utilization of new electrochemical systems there is a need for more robust and intelligent methods to define and track system performance during the life of the application. An example is the usage of Li-ion cells in Hybrid Electric Vehicle (HEV), Plug-in Hybrid Electric Vehicle (PHEV), and Electric Vehicle (EV) platforms, where anticipated aging effects are a significant aspect of battery design. In some cases, the eventual design of a cell or battery pack is over-engineered to account for unknown sources of performance fade or rates thereof, resulting in more costly battery systems.

As non-limiting test examples, the discussion herein concentrates on Gen2 Li-ion cells of the 18650 configuration, where these cells consist of a $LiNi_{0.8}Co_{0.15}Al_{0.05}O_2$ cathode (35 µm laminate), a MAG10 carbon anode (also 35 µm laminate), an electrolyte of a 3:7 mass ratio of EC to EMC with 1.2 M $LiPF_6$, and a 2300 series CELGARD® separator. Of course, embodiments of the present invention may be practiced with many other cell configurations.

Embodiments of the present invention demonstrate that simple yet informed direct current (DC) pulse methods can be used to obtain strategic quantities needed to assess cell performance over the life of a given cell, and that these quantities are surrogate measures for that obtained from time-consuming and costly Alternating Current (AC) methods of Electrochemical Impedance Spectroscopy (EIS) measurements. Specifically, constant-current pulses (charge and discharge) applied at current densities in the vicinity of the exchange current density ($i_o$) can yield a wealth of information regarding the ohmic impedance ($R_{ohmic}$), the intrinsic charge transfer impedance ($R_{ct,o}$), and other interfacial impedance contributions ($R_{int,\ Dc}$) such as that due to temperature-driven thermodynamic processes occurring at interfacial regions and related DC capacitive effects.

For short pulses that do not develop significant concentration polarization effects, the total cell impedance can be represented as:

$$R_{total,DC} = R_{ohmic} + R_{int}^{net} = R_{ohmic} + R_{ct,app} = R_{ohmic} + R_{ct,o} + R_{int,DC} \quad (1)$$

where for cell operation at normal ambient conditions, the intrinsic charge transfer impedance ($R_{ct,o}$) is the likely dominating term, growing appreciably as cells age. Also, $R_{int,DC}$ can dominate the total impedance under conditions of low temperature, as has been generally observed in data for Gen2 18650 cells. Note that here the apparent charge transfer impedance is defined as the net interfacial impedance.

Figure 3:
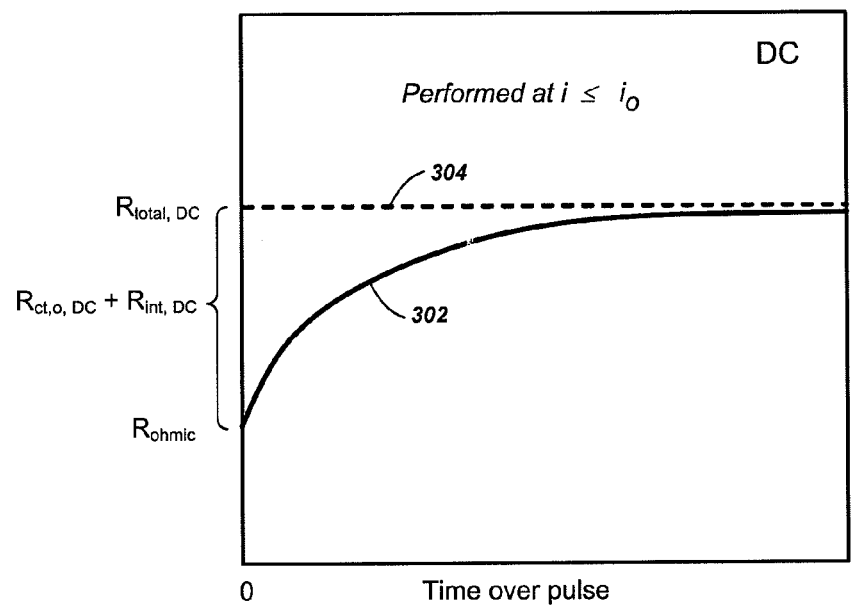
FIG. 3 illustrates quantities related to electrochemical cell impedance obtained using Direct Current (DC) techniques.

FIG. 3 illustrates quantities related to electrochemical cell impedance obtained using Direct Current (DC) techniques. Cell impedance is plotted relative to time over a pulse duration. As can be seen, the DC impedance 302 increases with increasing time over the pulse duration. At the beginning the DC impedance 302 is mostly from the ohmic impedance ($R_{ohmic}$) and over the pulse time the intrinsic charge transfer impedance ($R_{ct,o,DC}$) and other interfacial impedance contributions ($R_{int,\ DC}$) begin to contribute until the impedance begins to plateau near the total DC impedance 304 ($R_{total,DC}$). Herein, short yet mature pulses would typically be on the order of ≦20 seconds, wherein dR/dt has fallen to within a minimum target.

Figure 4:
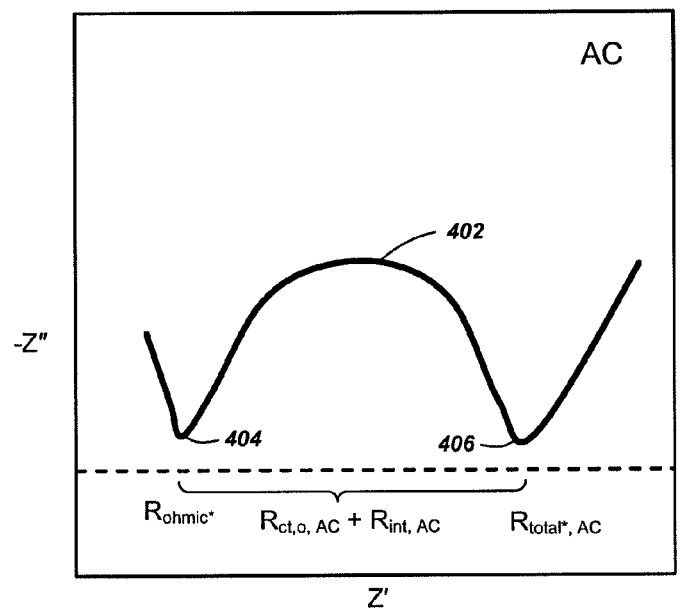
FIG. 4 illustrates quantities related to electrochemical cell impedance obtained using Alternating Current (AC) techniques.

FIG. 4 illustrates quantities related to electrochemical cell impedance obtained using Alternating Current (AC) techniques. Electrochemical impedance spectroscopy (EIS) measurements were used to obtain a Nyquist plot of AC impedance 402 on the complex plane between resistance on the x-axis and reactance on the y-axis. Inverted peak 404 indicates a point where the AC impedance 402 is mostly from the ohmic impedance ($R_{ohmic}$). Inverted peak 406 indicates where the AC impedance 402 is mostly near a high resistance of ($R_{total*,AC}$). Between inverted peak 404 and inverted peak 406, the AC impedance may be represented as substantially a combination of the intrinsic charge transfer impedance ($R_{ct,o,AC}$) and other interfacial impedance contributions ($R_{int,\ AC}$). In FIG. 4, $\{R_{ohmic*} = R_{ohmic} + R_{offset}\}$ and $\{R_{total*,AC} = R_{total,AC} + R_{offset}\}$ for an impedance offset $R_{offset}$ caused by ancillary equipment (e.g., test cables) that affects EIS measurements in the high-frequency range. Comparing DC ohmic impedance versus AC ohmic impedance can help isolate the offset term.

Figure 5:
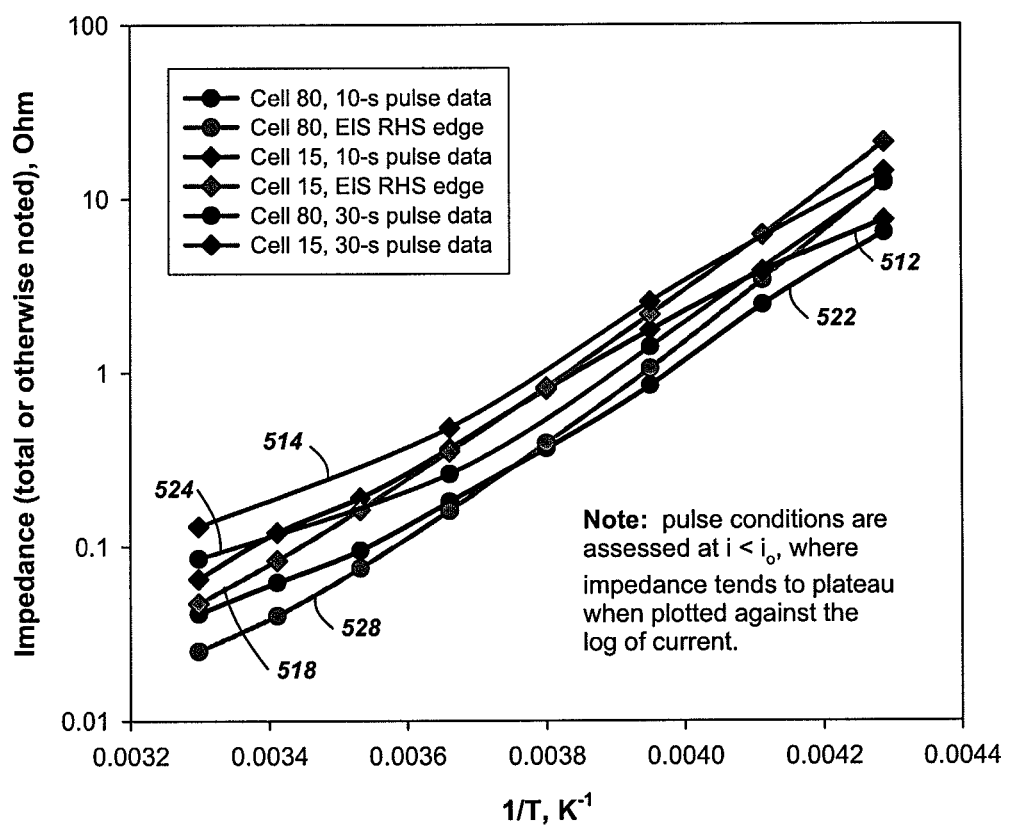
FIG. 5 illustrates Arrhenius-type plots to show a comparison of DC-test derived impedances and AC-test derived impedances for various electrochemical cells relative to inverse temperature.

FIG. 5 illustrates Arrhenius-type plots to show a comparison of DC-test derived impedances and AC-test derived impedances for various electrochemical cells relative to inverse temperature. FIG. 5 illustrates two different Gen2 18650 cells (i.e., Cell 15 and Cell 80) at 60% SOC. Cell 15 has approximately 50 to 55% performance fade, while Cell 80 has undergone 20 to 24% fade. The DC impedance values were derived from 10 second and 20 second constant-current discharge pulses. The AC impedance values were derived from EIS data along the right-hand side of the semicircles in FIG. 4 (i.e., where the AC impedance is mostly near a high resistance of $R_{total*,AC}$). Lines with data points represented with diamonds are for Cell 15 data and lines with data points represented with circles are for Cell 80 data. Thus, lines 512 and 514 illustrate DC impedance data for Cell 15 at a 10 second pulse and a 30 second pulse, respectively. Similarly, lines 522 and 524 illustrate DC impedance data for Cell 80 at a 10 second pulse and a 30 second pulse, respectively. Line 518 illustrates impedance derived from EIS data for Cell 15 and line 528 illustrates impedance derived from EIS data for Cell 15. As noted in FIG. 5, the pulse conditions are assessed at $i < i_o$ (i.e., current density less than the exchange current density) where the impedance tends to plateau when plotted against the logarithm of current.

Figure 6:
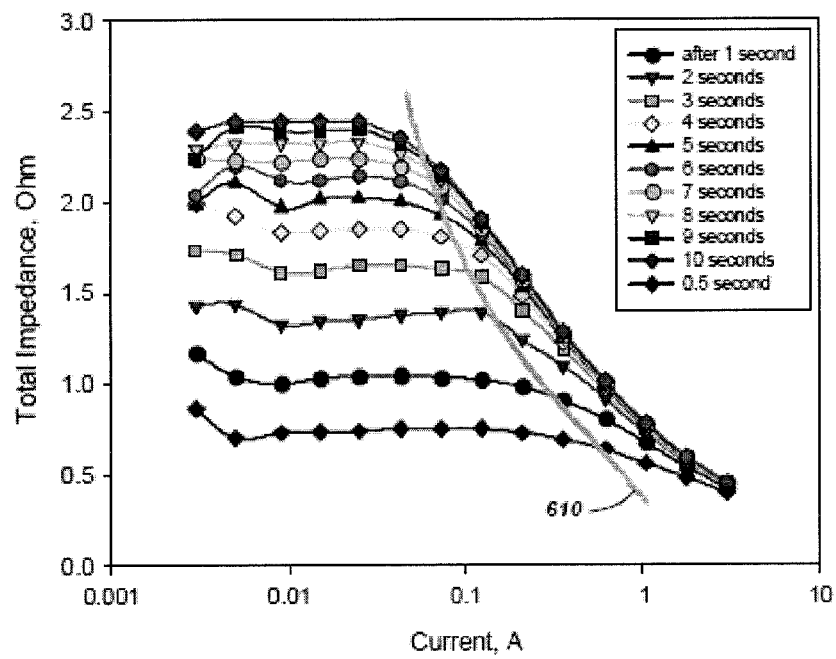
FIG. 6 illustrates total impedance relative to current for various constant-current discharge pulse durations for an electrochemical cell at −30° C.
Figure 7:
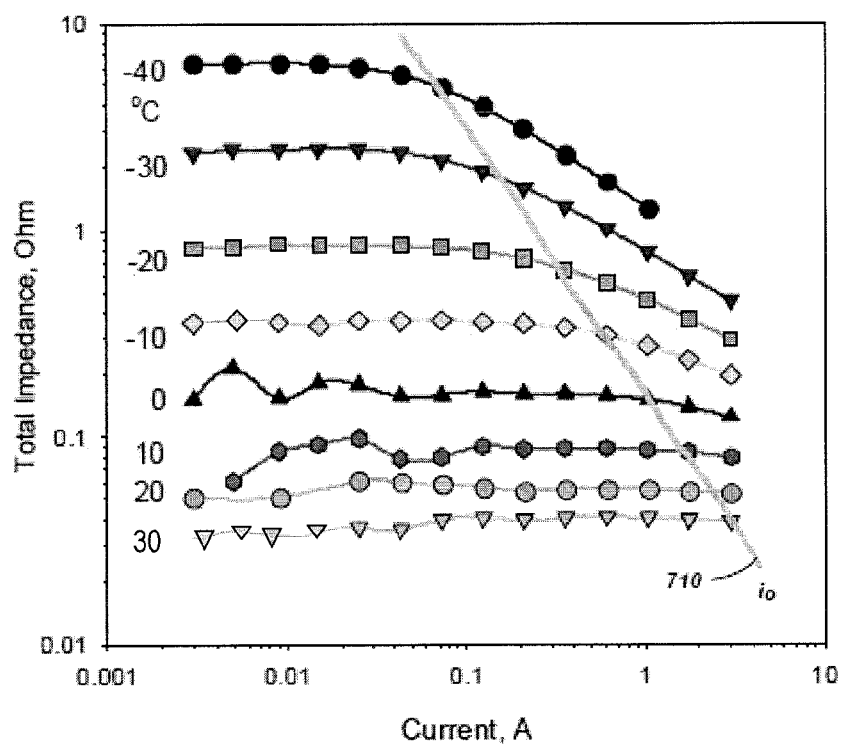
FIG. 7 illustrates total impedance relative to current for various temperatures for an electrochemical cell after the first 10 seconds of pulse time.

It should be emphasized that the various impedance terms in FIGS. 3, 4 and 5 are not equivalent between DC and AC modes. For example, the differences shown in FIG. 5 between AC and DC values are due in part to capacitive or polarization effects in the DC pulse mode, and because the AC mode of EIS effectively yields a composite or averaged response to alternating charge and discharge conditions. Seeing that there can be significant differences in such impedance data, care must be taken not to incorrectly assign an AC term to DC, or visa-versa. A common "mistake" along these lines is to assume that intrinsic charge transfer impedance is the same for AC and DC modes (i.e., $R_{ct,o,\ AC} = R_{ct,o,\ DC}$), which cannot be true since charge transfer must be properly defined for the DC mode in which the cell is being operated (cathodic vs. anodic process), and can be a function of pulse conditions since exchange current density ($i_o$) can vary over $t_{pulse}$ (as seen in FIG. 6) and over temperature (as seen in FIG. 7). The relation between exchange current density ($i_o$) and intrinsic charge transfer impedance ($R_{ct,o}$), is given in equation (20), and is discussed in later sections. It should be noted that $R_{ct,o,\ AC}$ is a composite or average charge transfer term over charge and discharge conditions. Equivalency between charge transfer impedances for charge and discharge is not assumed, since there can be an imbalance in kinetic rates between the two. In fact, the Gen2 cells mentioned herein are known to be charge limited, and thus have higher charge transfer impedance in the charge mode.

FIG. 6 illustrates total impedance relative to current for various constant-current discharge pulse durations for an electrochemical cell at –30° C. The data is for Cell 80 and illustrates an approximate trend line 610 for exchange current density ($i_o$) over the various discharge pulse durations.

FIG. 7 illustrates total impedance relative to current for various temperatures for an electrochemical cell after the first 10 seconds of pulse time. This data is also for Cell 80 and illustrates an approximate trend line 710 for exchange current density ($i_o$) over the various temperatures.

In FIGS. 6 and 7 it can be seen that there is more data scatter at low currents and higher temperatures. This may be due to extremely small voltage drops in those regions, which in some cases are sub-millivolt and difficult to render with high accuracy given test equipment limitations. Also seen in FIG. 7 is the linear behavior of the trend line 710 for exchange current density ($i_o$) for the shown conditions. This can be seen as a valuable relation between exchange current density ($i_o$) and temperature at a particular elapsed pulse time (here, 10 seconds). In general, such a linear relationship can allow interpolation or extrapolation of exchange current density ($i_o$) to conditions of interest in a diagnostic setting, such as arbitrary temperature and pulse duration.

Although there is not a clear equivalency between DC-derived impedance and AC-derived impedance terms, they do tend to track quite similarly over cell aging. That is, the rate of aging and how it affects impedance appears to be impacted by similar aging mechanisms when we compare DC data and AC data. Table 1 shows how well AC impedance values and DC impedance values track with each other for Gen2 cells 15 and 80 at 30° C. The data tracks very close on the relative scale, with respect to both aging and type of impedance method. This gives credibility to the notion that DC pulse data obtained at low currents in the vicinity of the exchange current can yield impedance rise (or conductance fade) information that is just as viable as that obtained via EIS.

TABLE 1 comparison of impedance ratios obtained at 30° C. for Gen2 cells of different aging. EIS data was obtained at the RHS edge of the semicircle region of Nyquist plots, and DC pulse data was obtained after 10-s elapsed discharge pulse time.

| Impedance ratio based on aging, given AC or DC approach | Impedance ratio based on AC or DC approach, given cell aging |
|---|---|
| EIS: $R_{Cell\ 15}/R_{Cell\ 80}$ = 1.843 | Cell 80: $R_{EIS}/R_{DC\ pulse}$ = 1.569 |
| DC Pulse: $R_{Cell\ 15}/R_{Cell\ 80}$ = 1.749 | Cell 15: $R_{EIS}/R_{DC\ pulse}$ = 1.489 |

Because cell performance should be tied to capability under the intended usage mode (DC pulse conditions), a DC-based evaluation of impedance (or conductance) is preferred over AC methods, and will be developed herein. Specifically, diagnostic testing analyses done in the vicinity of the exchange current density ($i_o$) are discussed in the context of evaluating the influence of cell aging on effective cell conductance. The exchange current density ($i_o$) is of central importance due to its meaning toward the demarcation between reversibility and irreversibility in electrochemical systems. Cell conductance fade is chosen as the basis instead of impedance rise since conductance fade is bounded between 0% to 100%, whereas impedance rise can be large, covering orders of magnitude. All discussion that follows assumes the DC basis unless otherwise noted, and that DC pulse impedance is derived via Ohm's Law.

3. Cell Performance Fade

Definition and Basis

Processes at interfacial regions can collectively govern cell performance, and their net contribution to impedance is an important metric for cell degradation over cell lifetime. Specifically, we can define performance fade (PF, not to be confused with power fade) as the reduction in cell conductance over aging. Since the effective cell conductivity at aging time t is:

$$\kappa_{cell}(t) = \frac{1}{R_{total}(t)} = \frac{1}{\sum_i R_i(t)} = \frac{1}{R_{ohmic}(t) + R_{int}^{net}(t) + \ldots} \quad (2)$$

then:

$$PF(t) = \left( \frac{\kappa_{cell}(t_o) - \kappa_{cell}(t)}{\kappa_{cell}(t_o)} \right) \quad (3)$$

Thus, whether from AC data or DC data, PF may be defined at a low-current baseline. PF values in terms of percentage are obtained by multiplying the result of equation (3) by 100. In order for PF to be applicable to higher current scenarios (e.g., L-Hybrid Pulse-Power Characterization (HPPC)), the conductance can be scaled to the new current via a recently developed modified Butler-Volmer expressions (θ–BV), which facilitates accurate prediction of the various impedance components within equation (1) over the pulse timeline.

Details of the modified Butler-Volmer expressions (θ–BV) are disclosed in U.S. patent application Ser. No. 12/765,384, now U.S. Pat. No. 8,346,495, entitled "SYSTEMS, METHODS AND COMPUTER READABLE MEDIA TO MODEL KINETIC PERFORMANCE OF RECHARGEABLE ELECTROCHEMICAL DEVICES," the disclosure of which is hereby incorporated by reference in its entirety.

PF is primarily comprised of two time-dependent contributions from $R_{ohmic}(t)$ and $R_{int}^{net}(t)$ that are scaled relative to the proportion of their contribution to $R_{total}$:

$$PF(t) = PF_{ohmic}\left(\frac{R_{ohmic}}{R_{total}}\right) + PF_{int}^{net}\left(\frac{R_{int}^{net}}{R_{total}}\right) \quad (4)$$

where the constituent PF terms in the RHS are determined analogous to that of equation (3):

$$PF_{ohmic} = \left( \frac{\kappa_{ohmic}(t_o) - \kappa_{ohmic}(t)}{\kappa_{ohmic}(t_o)} \right) \quad (5)$$

$$PF_{int}^{net} = \left( \frac{\kappa_{int}^{net}(t_o) - \kappa_{int}^{net}(t)}{\kappa_{int}^{net}(t_o)} \right) \quad (6)$$

These contributions can be represented along the aging timeline by sigmoidal functions, allowing prediction of PF past the extent of data. Details of sigmoidal functions and Multiple Sigmoid models (MSMs) are disclosed herein and in U.S. patent application Ser. No. 12/571,253, now U.S. Pat. No 8,467,984, entitled "SYSTEMS, METHODS AND COMPUTER READABLE MEDIA FOR ESTIMATING CAPACITY LOSS IN RECHARGEABLE ELECTROCHEMICAL CELLS," the disclosure of which is hereby incorporated by reference in its entirety.

Furthermore, the θ–BV expressions may be combined with a Generalized Electrochemical Rate Expression (GERE) based on sigmoidal rate expressions. With this combination, the GERE effectively trains the modified Butler-Volmer expression (θ–BV) in the pulse time domain, enabling determination of exchange current density as a function of pulse time, $i_o(t_{pulse})$. The combination of the θ–BV expressions and GERE gives a modified Butler-Volmer expression with a Generalized Electrochemical Rate Expression (θ–BV/GERE).

Each new addition of age-related impedance data over time will enable an updated regression and re-evaluation of MSM regression parameters, and hence updated and more accurate predictions of future fade with MSM models for PF of:

$$PF(t) = \sum_{i=1}^{n} \left[ 2PF_{ref,i} \left( \frac{1}{2} - \frac{1}{1+\exp\{a_i t^{b_i}\}} \right) \right] \quad (7)$$

and then from equation (3) we have:

$$PF(t) = \left( \frac{\kappa_{cell}(t_o) - \kappa_{cell}(t)}{\kappa_{cell}(t_o)} \right) \stackrel{!}{=} \sum_{i=1}^{n} \left[ 2PF_{ref,i} \left( \frac{1}{2} - \frac{1}{1+\exp\{a_i t^{b_i}\}} \right) \right] \quad (7b)$$

In equation (7), (i) denotes the type of fade mechanism up to n total types, ($a_i$) and ($b_i$) are terms that establish the rate of change over time t (i.e., aging kinetics), and ($PF_{ref,\,i}$) is the estimated upper boundary of performance fade of the $i^{th}$ mechanism under the conditions of the dataset, given a batch system. That is, ($a_i$) is the rate constant and ($b_i$) is related to the effective order of reaction for mechanism (i). Thus, an MSM enables determination of mechanism-specific contributions to PF, and predictions of such once the parameters are sufficiently mature to reflect trends over time. Thus, MSM parameters are specific to cell aging conditions, and so might vary over aging time if aging conditions change over time. An example of applying the MSM to age-dependent EIS data is given later.

Other useful relationships can be derived to facilitate quantification of various contributing terms. If impedance of type (i) at time (t) is considered as a sum of the initial time-zero value and the net increase from ($t_o$) to (t), then total apparent impedance is expressed as:

$$R_{total}(t) = \sum_i R_i(t) = \sum_i \left( R_i(t_o) + \int_{t_o}^{t} dR_i \right) = \sum_i (R_i(t_o) + [\Delta R_i]_{t_o}^t) \quad (8)$$

Then:

$$\kappa_{cell}(t) = \frac{1}{R_{total}(t)} = \left( \sum_i (R_i(t_o) + [\Delta R_i]_{t_o}^t) \right)^{-1} \quad (9)$$

And:

$$PF(t) = \left( \frac{\kappa_{cell}(t_o) - \kappa_{cell}(t)}{\kappa_{cell}(t_o)} \right) = \frac{\frac{1}{\sum_i R_i(t_o)} - \frac{1}{\sum_i (R_i(t_o) + [\Delta R_i]_{t_o}^t)}}{\frac{1}{\sum_i R_i(t_o)}} \quad (10)$$

Which gives:

$$PF(t) = \frac{\sum_i ([\Delta R_i]_{t_o}^t)}{\sum_i (R_i(t_o) + [\Delta R_i]_{t_o}^t)} = \left( \frac{\text{Net change in impedance by time } t}{\text{Total impedance at time } t} \right) \quad (11)$$

or:

$$PF(t) = \kappa_{cell}(t) \sum_i ([\Delta R_i]_{t_o}^t) \quad (12)$$

From these expressions, component-wise contributions to conductance fade are now directly inter-relatable to impedance terms:

$$PF(t) = \sum_i PF_i(t) = \frac{\sum_i ([\Delta R_i]_{t_o}^t)}{R_{total}(t)} = \left( \underbrace{\frac{[\Delta R_{ohmic}]_{t_o}^t}{R_{total}(t)}}_{(I)} + \underbrace{\frac{[\Delta R_{int}^{net}]_{t_o}^t}{R_{total}(t)}}_{(II)} + \ldots \right) \quad (13)$$

where the terms I, II, etc., are the fractions of performance fade attributable to distinct impedance sources. Thus the individual fractions are represented as:

$$PF_i(t) = \frac{[\Delta R_i]_{t_o}^t}{R_{total}(t)} \quad (14)$$

Next, performance fade components can be related to MSM expressions, as per equation (7):

$$PF_i(t) = \frac{[\Delta R_i]_{t_o}^t}{R_{total}(t)} \stackrel{!}{=} 2PF_{ref,i} \left( \frac{1}{2} - \frac{1}{1+\exp\{a_i t^{b_i}\}} \right) (= MSM_i) \quad (15)$$

Lastly, the relative fractional contributions of performance fade are determined by:

$$f_{PF,i}(t) = \frac{PF_i}{PF(t)} \stackrel{!}{=} \frac{MSM_i(t)}{MSM(t)} \quad (16)$$

Thus, it can be seen that MSM results can be used to back-calculate the various $\Delta R_i(t)$ terms, given their time-zero values.

4. Charge Transfer Kinetics

Evaluation Via a Modified BV Model

The modified Butler-Volmer expression (θ–BV), as mentioned above, is a very useful and accurate expression establishing a relationship between current and impedance over arbitrary condition of temperature, SOC, and cell aging. The θ–BV expression (ohmic corrected) is:

$$i = i_o \left[ \exp\left(\frac{\theta_{eff}\alpha_{a,o}F(\eta - \eta_{ohmic})}{RT}\right) - \exp\left(\frac{-\theta_{eff}\alpha_{c,o}F(\eta - \eta_{ohmic})}{RT}\right) \right] \quad (17)$$

where $\theta_{eff}$ is the average effective fraction of electrode surface availability for charge transfer, a function of temperature, aging, and possibly SOC. The inclusion of $\theta_{eff}$ is significant to capturing the influence of the heterogeneous electrode environment in Li-ion systems on the effective charge transfer kinetics.

The effective transfer coefficients for anodic (a) and cathodic (c) cell conditions may be represented as:

$$\alpha_a = \theta_{eff}\alpha_{a,o} \text{ and } \alpha_c = \theta_{eff}\alpha_{c,o} \quad (18)$$

Apparent charge transfer resistance (with a basis of effective electrode surface availability $\theta_{eff}$) may be represented as:

$$R_{ct,app} = \left(\frac{\eta - \eta_{ohmic}}{iA_e}\right)_{small\,\eta} = \left(\frac{RT}{i_o F(\alpha_a + \alpha_c)A_e}\right) = \left(\frac{RT}{2i_o nF\theta_{eff}\beta_o A_e}\right) \quad (19)$$

Intrinsic charge transfer resistance (based on reference condition $\theta_{eff}=1$, full surface availability for charge transfer) may be represented as:

$$R_{ct,o} = \left(\frac{RT}{i_o F(\alpha_{a,o} + \alpha_{c,o})A_e}\right) = \left(\frac{RT}{2i_o nF\beta_o A_e}\right) \quad (20)$$

And:

$$\left\{ \begin{array}{c} \text{Charge tranfer resistance attributed} \\ \text{to mass transfer limitations at critical} \\ \text{electrode interfaces (e.g., SEI)} \end{array} \right\} = \quad (21)$$

$$R_{int} = (R_{ct,app} - R_{ct,o}) = \left(\frac{RT}{2i_o nF\beta_o A_e}\right)\left(\frac{1}{\theta_{eff}} - 1\right) \quad (21)$$

Then:

$$\theta_{eff} = \frac{R_{ct,o}}{R_{ct,app}} = \frac{R_{ct,o}}{R_{ct,o} + R_{int}} \quad (22)$$

Total cell resistance for short pulses (as per equation (1)) may be represented as:

$$R_{total} = R_{ct,app} + R_{ohmic} = R_{int} + R_{ct,o} + R_{ohmic} \quad (23)$$

where it is assumed Joule heating and concentration overpotential are minor or negligible effects for relatively short pulses.

As mentioned previously, the θ–BV approach (and quantities derived from it) is extended over the pulse time domain by coupling it with the GERE.

5. General Methodology for Diagnostic Testing Evaluation of Performance Fade Via Cell Conductance The previous discussion has provided a foundation for developing a standard approach to assess cell conductance over aging, using diagnostic testing to isolate significant terms used to track various contributions to the aging process. Unless otherwise noted, pulses herein refer to direct-current (DC) discharge pulses.

As stated earlier, the terms "mechanistic level diagnostics" and "mechanistic level models," as used herein, refer to a diagnostics process for electrochemical cells and a modeling process for electrochemical cells that are based on analysis and modeling of physical characteristics of the electrochemical cells. These physical-characteristics-based processes are different from processes that use empirical testing of the electrochemical cells and simply develop curves that fit the empirical data. However, that is not to say that development of the mechanistic level processes is necessarily completely devoid of empirical data. Empirical information may be used to verify that mechanistic level models are properly modeling physical characteristics of the electrochemical cells and, in some cases, empirical information may be used to train and refine the mechanistic level models.

Figure 8:
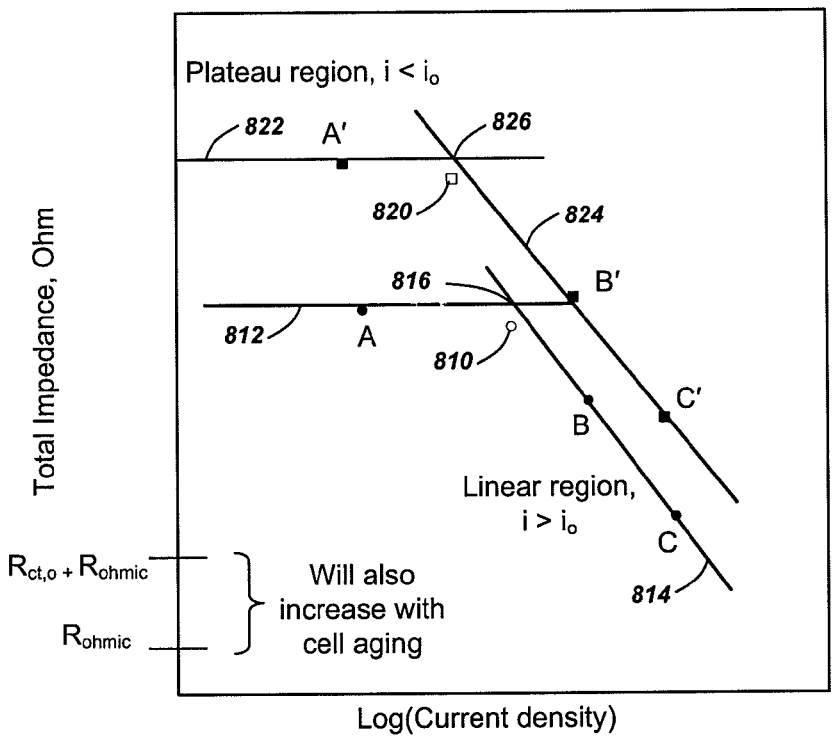
FIG. 8 shows results of a method for estimating exchange current density ($i_o$) for a cell based on three constant-current pulses that bracket exchange current density ($i_o$) per data trends.

FIG. 8 shows results of a method for estimating physical characteristic of cell conductance over aging for a cell based on empirical information from three constant-current pulses that bracket exchange current density ($i_o$) per data trends. The exchange current density ($i_o$) per data trends may be derived from observed data, such as that of FIG. 9.

Figure 9:
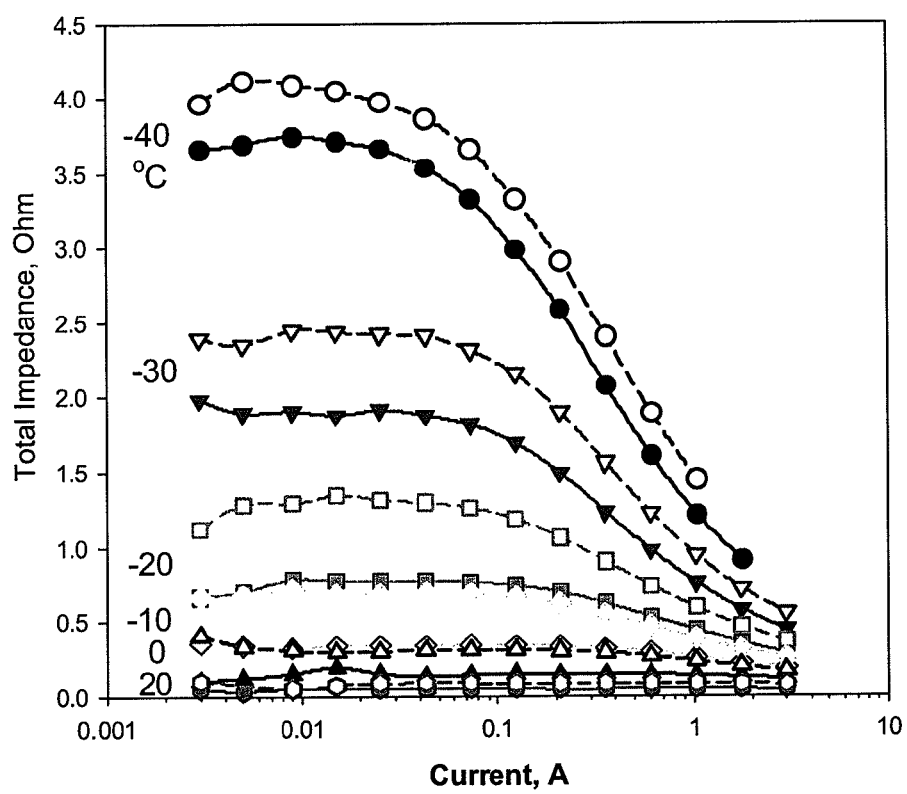
FIG. 9 shows total impedance relative to current after 4-second discharge pulses at different temperatures.

FIG. 9 shows total impedance relative to current after 4-second discharge pulses for cell 14 (open symbols) and cell 80 (closed symbols) at different temperatures. The position of exchange current density ($i_o$) may be approximated by the location of inflection in each curve (as illustrated in FIG. 6), and is seen to trend to lower values for higher cell aging.

The procedure for estimating the cell conductance is summarized below as the following acts:

1. Start by a thorough initial (beginning of life, BOL) characterization of cell kinetic performance at the temperature(s) and SOC(s) of interest, performing 10 to 20-second pulses at numerous currents so as to accurately determine the magnitude of exchange current density ($i_o$), as per FIGS. 6 and 9. At least two temperatures are suggested to establish an Arrhenius trend-line for each cell.
2. A θ–BV model regression (equation (17)) on ohmic-corrected data will yield the value of exchange current density ($i_o$) at BOL, $i_{o,BOL}$, and effective electrode surface availability ($\theta_{eff}$) for a cell at particular conditions of temperature, SOC, charge or discharge, aging, and elapsed pulse time. It has been observed in previous Gen2 18650 cell data that effective electrode surface availability ($\theta_{eff}$) is largely invariant of pulse time, unlike exchange current density ($i_o$).
3. Calculate the intrinsic charge transfer impedance ($R_{ct,o}$) through equation (20).
4. Perform pulses at various currents relative to exchange current density at BOL ($i_{o,BOL}$), such as 0.5, 2, and 4 times $i_{o,BOL}$. FIG. 8 shows three points (A, B, and C) for a new cell using pulses at 0.5, 2, and 4 times the exchange current density at BOL ($i_{o,BOL}$) 810. A plateau region 812 is derived based on the current pulse data (A) that is less than $i_{o,BOL}$ 810. A linear region 814 is derived as a line between current pulse data (B and C) that are greater than $i_{o,BOL}$ 810. The intersection point 816 of the two lines (812 and 814) is found and its offset relative to $i_{o,BOL}$ 810 is noted. The offset should be defined as a factor slightly greater or lesser than unity, denoted $f_{offset}$.
5. Determine $R_{ohmic}$ by extrapolating one or more of the pulse conditions in act 4 to zero pulse time.
6. After a prescribed amount of cell aging ($t_{aging,1}$) repeat act 4, using currents A, B, and C.

7. Determine $R_{ohmic}$ by extrapolating one or more of the pulse conditions in act 4 to zero pulse time.
8. The intersection point of the two linear regions is the approximate location of exchange current density ($i_o$), which mathematically gives $i(t_{aging,1})$ 820:

$$i_o(t_{aging,1}) \approx f_{offset} i_{max} 10^{\left[\frac{(R_A - (R_{ohmic} + R_{ct,o}))}{(R_C - R_B)}(\log(i_C) - \log(i_B))\right]} \quad (24)$$

for first aging analysis where $i_{max}$ is the current density at which $R_{total}$ equals the sum of $R_{ohmic}$ and $R_{ct,o}$, indicating that the mass transport contribution of impedance (beyond that which is due to intrinsic charge transfer kinetics) is effectively zero, as discussed in U.S. patent application Ser. No. 12/765,384, now U.S. Pat. No. 8,346,495. Note that in cases where conditions A, B, and C produce very similar impedance values where $R_A = R_B = R_C = R_{ohmic} = R_{ct,o}$, the above expression yields $i_o(t_{aging,1}) \approx f_{offset} i_{max}$, indicating that a cell is operating under largely reversible conditions within the range of conditions under consideration. Lastly, since many terms in equation (24) are sensitive to pulse duration, then a consistent basis must be maintained for pulse duration for this analysis over the life of a cell.
9. Perform pulse at $i_o(t_{aging,1})$ to determine voltage drop and impedance at this condition.
10. Using equation (17), determine value of effective electrode surface availability ($\theta_{eff}$) at this point of aging by setting $i=i_o$, and utilizing the voltage drop from act 9 to solve iteratively for $\theta_{eff}$.
11. Using equation (20), calculate the intrinsic charge transfer impedance ($R_{ct,o'}$) at $t_{aging,1}$.
12. After a second aging period, perform pulses at various currents relative to $i_o(t_{aging,1})$ 820, such as 0.5, 2, and 4 times $i_o(t_{aging,1})$ 820. FIG. 8 shows three points (A', B', and C') for the aged cell using pulses at 0.5, 2, and 4 times $i_o(t_{aging,1})$ 820. A plateau region 822 is derived based on the current pulse data (A') that is less than $i_o(t_{aging,1})$ 820. A linear region 814 is derived as a line between current pulse data (B' and C') that are greater than $i_o(t_{aging,1})$ 820. The intersection point 826 of the two lines (822 and 824) is found and its offset relative to $i_o(t_{aging,1})$ 820 is noted.
13. Determine $R_{ohmic}$ by extrapolating one or more of the pulse conditions in act 12 to zero pulse time.
14. Calculate the exchange current density for the second aging period as:

$$i_o(t_{aging,2}) \approx \quad (25)$$

$$f_{offset'} i_{max'} 10^{\left[\frac{(R_{A'} - (R_{ohmic'} + R_{ct,o'}))}{(R_{C'} - R_{B'})}(\log(i_{C'}) - \log(i_{B'}))\right]}$$

for second aging analysis where terms marked with an apostrophe (') represent the second (or successively greater) aging period. Equations (24) and (25) could alternately be stated in terms of current instead of current density. Current (I) is obtained by multiplying the current density (i) by the electrode surface area (e.g., $I_o = i_o * A$).

15. Perform pulse at $i_o(t_{aging,1})$ to determine voltage drop and impedance at this condition.
16. Using equation (17), determine value of $\theta$ effective electrode surface availability ($\theta_{eff}$) at this point of aging by setting $i=i_o$, and utilizing the voltage drop from act 15 to solve iteratively for $\theta_{eff}$.
17. Using equation (20), calculate the intrinsic charge transfer impedance ($R_{ct,o}$) at $t_{aging,2}$, denoted $R_{ct,o'}$.
18. Repeat acts 12-17 for successive aging periods, noting the change in key quantities over aging, such as $i_o$, $R_{ct,o}$, $R_{int}$, $R_{total}$, $R_{ohmic}$, $\theta_{eff}$ etc.
19. Utilize MSM and related expressions to track and predict conductance fade (e.g., equations 7, 15, and 16). The basis for conductance fade recommended herein is the change in cell conductance (inverse impedance) at the exchange current density ($i_o$) over cell aging, using consistent conditions of temperature, SOC, charge or discharge, and elapsed pulse time. A significant parameter here will be temperature, since it might prove difficult to consistently perform in-situ diagnosis of cells within a vehicle pack at a precise temperature. Thus, a family of temperatures or a reasonable temperature correlation (Arrhenius) can be used.
20. Utilize $\theta$-BV as needed to assess impedance at arbitrary pulse conditions, based on the exchange current and $\theta_{eff}$ as f(aging). As an example, the impedance related to an arbitrary HPPC pulse can be evaluated as f(aging).

As seen in FIG. 9, in cases for cells having low impedance at the diagnosis temperature, the behavior of impedance over log(current) will be more of a straight line instead of the rendering given in FIG. 8. In such cases, and for relatively short pulses, note that:

$$R_{total} \cong R_{ct,o} + R_{ohmic} \quad (26)$$

which implies that $R_{int}$ is negligible at such conditions. Thus, intrinsic charge transfer impedance ($R_{ct,o}$) is easily found from equation (26), and exchange current density ($i_o$) is then determined via equation (20). Implied under such conditions are; (1) intrinsic charge transfer impedance ($R_{ct,o}$) might be seen as largely invariant over pulse time until other factors come into play (e.g., concentration polarization and Joule heating), and (2) exchange current density ($i_o$) might be relatively high, might not vary much over pulse time, or might be both relatively high and not vary much over pulse time.

Also of note from FIG. 8, exchange current density ($i_o$) decreases over cell aging, thus, intrinsic charge transfer impedance ($R_{ct,o}$) will increase over cell aging. Comparisons of parameters over the various $t_{aging}$ times should be performed at the same conditions of temperature, SOC, and $t_{pulse}$. The magnitude of the impedance terms shown in FIG. 8 may be exaggerated in some cases (e.g., ambient temperature), but not other cases (e.g., low temperature).

6. Other Observations and Examples

From FIG. 5 it becomes apparent that by matching the elapsed pulse time to some scale of the inverse frequency at the right-hand-side edge of each semicircle (FIG. 4), it might be possible to line up the AC and DC curves more closely, making it possible to construct essential features of a Nyquist plot based on DC pulse data. Comparing the AC and DC-based curves in FIG. 5, this process would involve looking at shorter pulse data at higher temperatures, and longer pulse data at colder conditions. The square-root of inverse frequency found at the EIS RHS edge of each semicircle region (FIG. 4) was used for this adjustment, and results are given in FIG. 10.

Figure 10:
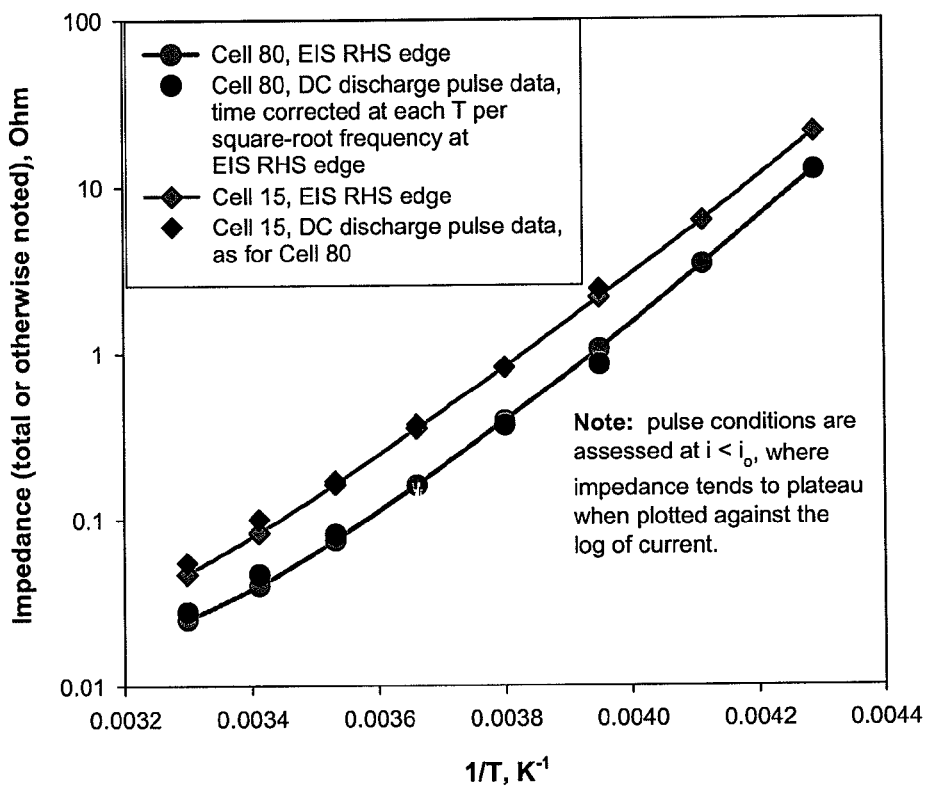
FIG. 10 is an Arrhenius-type plot showing a comparison of impedance plots for total AC real impedance at the Electrochemical Impedance Spectroscopy (EIS) semicircle Right-Hand Side (RHS) edge of the semicircle region versus adjusted DC discharge pulse total impedance.

FIG. 10 is an Arrhenius-type plot showing a comparison of impedance plots for total AC real impedance at the EIS RHS edge of the semicircle region versus the DC discharge pulse total impedance obtained at the time basis of square-root of inverse frequency found at the EIS semicircle edge. In FIG. 10 it can be seen that the AC and DC pulse curves align in close agreement once this "adjustment" is made in the DC pulse time basis.

Figure 11:
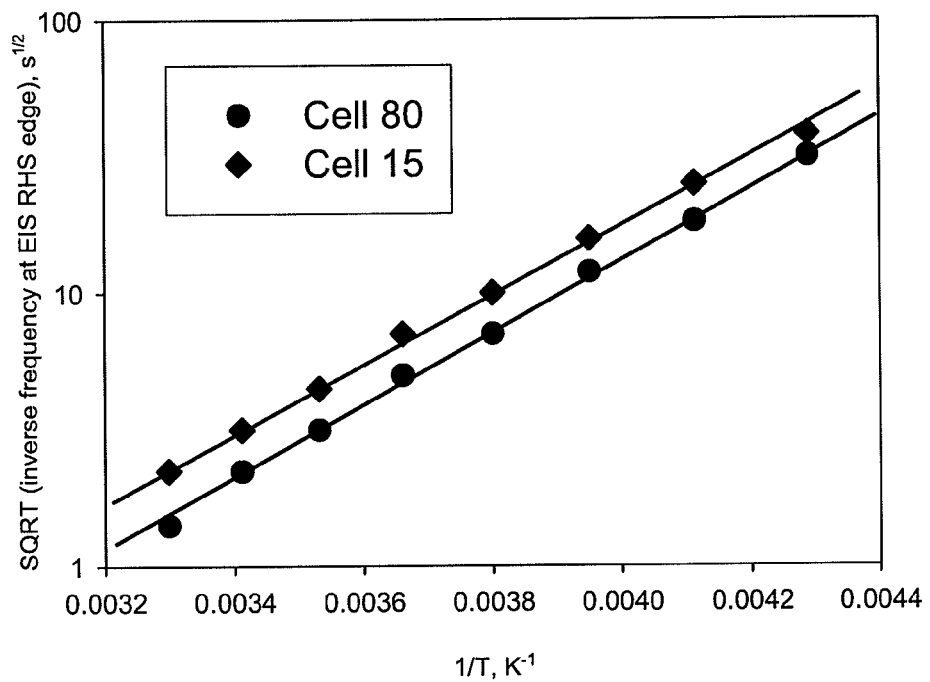
FIG. 11 illustrates a square-root of inverse frequency found at the EIS semicircle edges for electrochemical cells relative to the inverse frequency.

FIG. 11 illustrates the square-root of inverse frequency found at the EIS semicircle edges for cells 15 and 80. Taken with FIG. 10, such linear behavior infers it should be possible to construct EIS-type quantities over temperature based on well-designed DC pulses.

Figure 12:
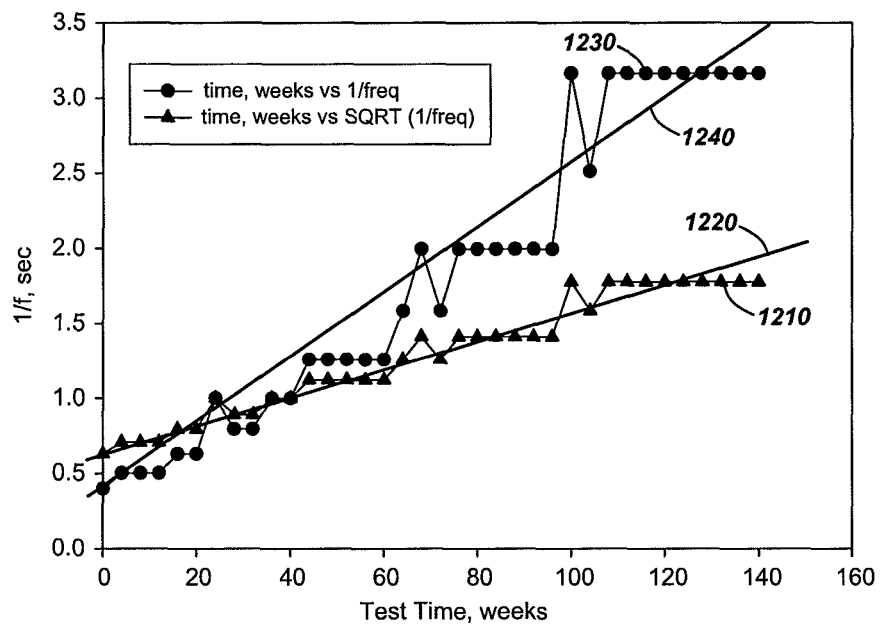
FIG. 12 is a plot of inverse frequency at the EIS semicircle RHS edge as a function of cycle-life aging for an electrochemical cell.

FIG. 12 is a plot of inverse frequency at EIS semicircle RHS edge as a function of cycle-life aging for Gen2 cell 14. Of particular significance is the strong linear correlation of SQRT(1/freq) (1210) over test time. This strong correlation is further evidence for the relevancy of the SQRT(1/freq) basis. The linear behavior is clearly seen by trend line 1220 approximating the behavior of the SQRT(1/freq) (1210). A plot of 1/frequency 1230 is given for comparison, which gives a much poorer linear trend 1240. The linear results of FIG. 12 demonstrate a powerful tool for predicting the appropriate frequency over cell aging, and thus, predicting the elapsed low-current pulse time that would be necessary to estimate EIS-type parameters for impedance, as discussed in FIGS. 10 and 11. Because EIS is an AC technique, the square-root approach to inverse frequency yields what is effectively a geometric mean of time required to produce an analogous impedance under a DC pulse. In FIG. 12 plateaus are seen in the data since EIS protocol makes use of a matrix of discrete frequencies. Thus, the true frequency of interest could be above or below a given plateau, giving a profile very close to the shown linear trend.

In practice, the slope of the linear trend 1220 would be related to a particular cell chemistry's bulk degradation rate under specific aging conditions. From linear analysis we can then formulate an accurate estimate for the DC pulse time required to render an analogous impedance at a specified amount of cell aging:

$$t_{DC} = \sqrt{1/\text{freq}(t_{aging})} = \sqrt{1/\text{freq}_{BOL}} + m_{freq} t_{aging} \quad (27)$$

again, where the connection to the geometric mean of AC response is assumed. Initially, the slope term ($m_{freq}$) can be estimated from historical data from similar cell chemistries, then updated with periodic EIS measurements. According to FIG. 12, the slope for the Gen2 chemistry is accurately established early on, and only needs occasional verification later in test time. Application to other cell chemistries should see some degree of similarity.

7. Case Study

Applying the MSM to Conductance Fade Data from EIS Measurements

The robust utility of the MSM as applied to conductance fade (equation (7)) is now demonstrated here for averaged EIS data taken for Gen2 18650 cells cycle-life tested at 60% SOC and 25° C. The RHS edge of the semicircle region is the demarcation used to quantify the real impedance (and inversely, real conductance) of the cells up to the start of the Warburg region. Based on the beginning of life conductance, the conductance fade was tracked over cell aging.

Figure 13:
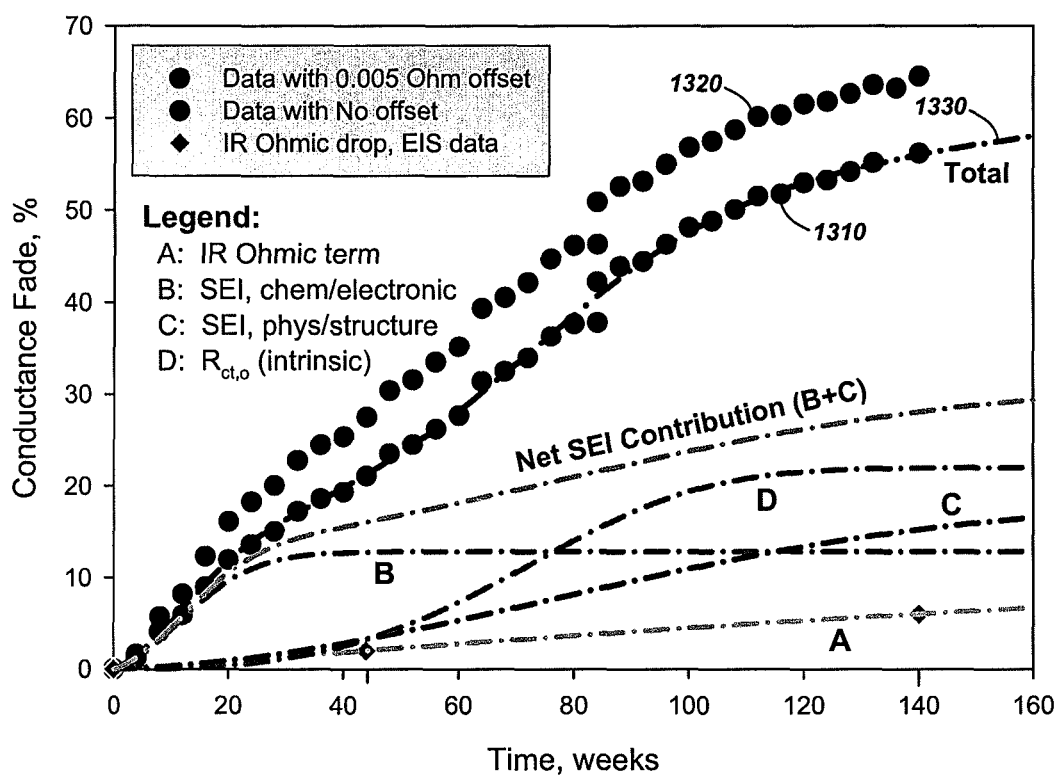
FIG. 13 illustrates average conductance fade and various contributions thereto, based on the EIS semicircle RHS edge, for electrochemical cells cycle-life tested at 60% SOC, 25° C.

FIG. 13 illustrates average conductance fade 1310 based on EIS semicircle RHS edge, for Gen2 cells cycle-life tested at 60% SOC, 25° C. MSM results are included, showing high fidelity and exceptional model accuracy. Shown also is re-plotted data 1320 if a small impedance offset is accounted for that is related to non-cell contributions to high frequency responses.

A multi-component MSM form was applied to the conductance fade data 1310 in accordance to the plausible impedance sources (equations (1) and (23)), and the regression results are shown as line 1330. A four-component model is used, which includes an ohmic contribution (A), two SEI-specific contributions (chemistry/electronic B and physical/structure C), and the contribution from the intrinsic charge transfer resistance ($R_{ct,o}$)(D). The splitting of the conductance fade into ohmic and interfacial contributions is supported by the observed impedance growth rates in the original EIS Nyquist plots, which showed that the interfacial impedance growth rate is variable within different ranges of reference performance tests, indicating more than one fade mechanism at work. Initial interpretation of the MSM results is that the ohmic component is a minor contributor to fade overall, while the interfacial mechanisms could be due to changes in SEI chemical, structural, and physical properties, and the effective charge transfer kinetics. A detailed discussion of these mechanisms is given below. It may be important to allow for such distinct mechanisms since it is valuable to determine the interplay or interdependence between charge transfer kinetics and SEI properties. Note that although EIS data was used in this example, the MSM is equally applicable to conductance fade data from DC pulse data, such as that derived from hybrid pulse-power characterization (HPPC) testing (see FIG. 15), or power fade data (FIG. 16), making it amenable to common performance data.

Toward understanding aging mechanisms as they pertain to cell conductance, the segregation of charge transfer impedance ($R_{ct}$) and SEI contributions to the overall interfacial impedance is important in understanding the interplay between these terms. It is asserted here that there are at least four primary impedance terms that impact cell conductance and its change over aging time: IR ohmic drop ($R_{ohmic}$), SEI impedance due mostly to near-term inorganic chemical reactions and related changes in electronic properties ($R_{SEI, chem/electronic}$ or $R_{SEI,1}$), SEI impedance due to long-term polymerization reactions and related physical/structural changes of the SEI ($R_{SEI, phys./structure}$ or $R_{SEI,2}$), and the intrinsic charge transfer impedance as evaluated at the exchange current density ($R_{ct,o}$). Here, the effective charge transfer impedance is broadly defined as a summation of these last three terms:

$$R_{ct,eff} = R_{ct,o} + R_{SEI,1} + R_{SEI,2} \equiv R_{int} \quad (28)$$

and then as before:

$$R_{total} = R_{ohmic} + R_{ct,eff}$$

for situations where concentration polarization contributions are not significant. FIG. 13 provides a rendering of the relative contributions of these terms regarding the conductance fade of Gen2 Li-ion cells cycle-life aged at 25° C. and 60% SOC. Again, conductance fade in FIG. 13 is based on EIS data, where the right side semicircle edge was used as the furthest demarcation of real impedance. MSM-based expressions yielded results for the constituent curves (A, B, C, D) and their sum is the "Total" curve (i.e., average conductance fade 1330) as indicated (see equations (7) and (15)).

First, it is viable to assert that the nature of the SEI chemical, physical, electronic, rheological, and morphological characteristics should have an influence on the effective charge transfer rate ($R_{ct,eff}$) experienced at the electrode surface. The $R_{ct,eff}$ term and the charge transfer rate related thereto should be dependent on SEI contributions since the rate of lithium transport to the electrode surface is dependent on SEI properties. The magnitude of this influence is a significant issue: there can be conditions under which SEI films have lesser impact on the charge transfer rate, such as when a cell is relatively un-aged and the SEI films are less resistive. Under this scenario, the intrinsic charge transfer rate could be slower than the lithium transport through the SEI. However, as the SEI changes over time through growing thicker, growing more ionically resistive, or becoming less porous and more tortuous, the charge transfer process will be more affected by the nature of the SEI and $R_{ct,eff}$ will correspondingly increase. This effect is seen in FIG. 13, where the SEI attributed mass-transport contribution from $R_{SEI,1}$ (curve B) is initially higher than that of $R_{ct,o}$ (curve D), eventually reaching a plateau after about 40 weeks. This trend is in complete agreement with capacity fade model results for these cells that showed initial lithium loss occurred at an initially high rate. Such lithium consumption in the SEI during initial periods will most likely lead to the formation of highly resistive films composed in part of inorganic lithium compounds such as LiF, and hence could dominate early conductance loss in some cases. The conductance losses attributed to the other terms intrinsic charge transfer impedance ($R_{ct,o}$) and $R_{SEI,2}$ (curve C) are seen to lag behind the first SEI contribution until about 60 weeks, whereupon they experience a more noteworthy increase for the remainder of testing. The trending seen in curves C and D infers that there is some degree of dependency of intrinsic charge transfer impedance ($R_{ct,o}$) on $R_{SEI,2}$. The increase in performance loss due intrinsic charge transfer impedance ($R_{ct,o}$) is due to the cumulative effects of higher $R_{SEI}$, reduced surface conduction due to reduced surface availability (fewer surface ingress sites as a result of surface fouling by side reactions or altered SEI structure), fewer intercalation sites, etc. Therefore, the intrinsic charge transfer impedance ($R_{ct,o}$) term appears to carry with it some aspects of SEI properties encompassed by $R_{SEI,2}$, such as the change of SEI porosity, tortuosity, and surface morphology over time. Hence, the charge transfer rate and SEI characteristics may be intractably linked.

Thus, to summarize complex dynamic aging mechanisms as they pertain to cell conductance, the primary bulk mechanisms appear to be; (1) increase of cell ohmic resistance, (2) early increase in SEI impedance due largely to LiX compound formation (prolonged formation process), (3) slow but steady increase in SEI impedance due to long-term polymerization reactions, SEI structural changes (such as thickening, changes in porosity and pore dimensions), and changes in surface morphology, and (4) resultant or dependent increase in intrinsic charge transfer impedance ($R_{ct,o}$) due to a number of factors that affect effective movement of lithium toward sites of charge transfer and subsequent insertion. From FIG. 13 it is determined that the theoretical thermodynamic maximum extent of conductance loss for the test conditions listed is about 64%, assuming no additional mechanisms later in testing and no further significant higher order interactions between mechanisms.

The aspect of rate-limiting processes or conditions residing at key interfacial regimes such as the SEI is a correct kinetic interpretation of rate processes of reactions occurring in proximity to such interfaces. It is important to note that the same mechanisms addressed in the MSM capacity fade model have bearing on cell conductance behavior over time: loss of available ionic lithium, and loss of active available intercalation sites (i.e., loss of "active material"). Within these two bulk mechanisms reside numerous sub-contributions that yield the effective observed behavior.

Using MSM-based data regression it is possible to determine the initial impedance rise at the SEI due to lithium consumption, since it is intuitively correct to suggest that inorganic chemical reactions involving a plentiful reactant (lithium) will occur more rapidly than processes that involve polymerization reactions and corresponding physical changes to the SEI. The intrinsic charge transfer impedance ($R_{ct,o}$) cannot be clearly segregated from the term that reflects physical and structural changes to the SEI over aging unless there are other independent data or models that address the relative proportions of these $R_{ct,o}$ and $R_{SEI,2}$ contributions over cell aging. That is, by using a single model, data of the type in FIG. 13 do not directly allow determination of such "nested" contributions without introducing undue arbitrariness into model parameters.

However, it was determined that a combination of independent models (i.e., MSM and θ–BV (kinetics model)) provides synergy in isolating the relative contributions for the foremost mechanisms mentioned above.

Figures 14A, 14B:
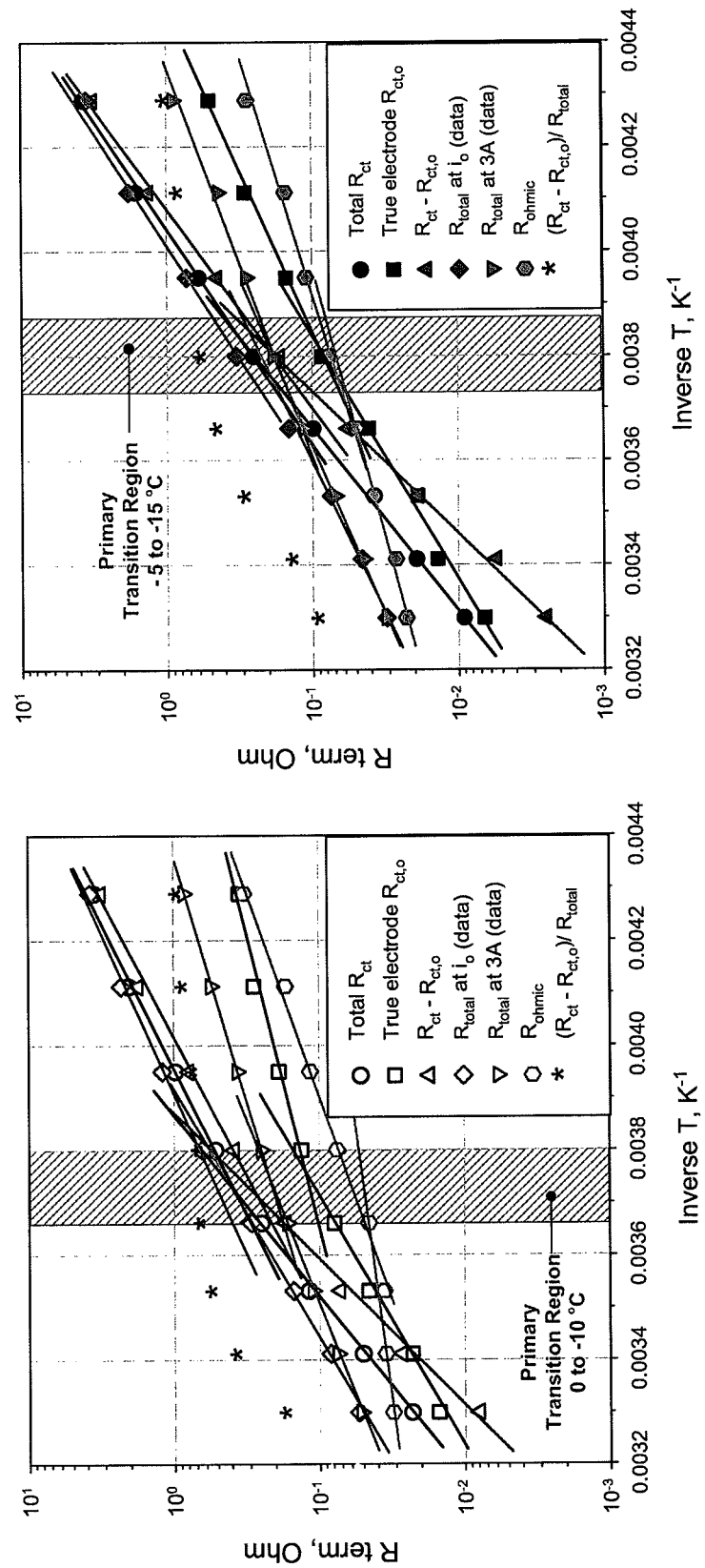
FIGS. 14A and 14B illustrate term-wise impedances for electrochemical cells 14 (55% power fade) and 80 (20% power fade) after 4-second discharge pulses, as determined by a modified Butler-Volmer (θ−BV) model.

FIGS. 14A and 14B illustrate term-wise impedances for Gen2 18650 cell 14 (55% power fade) and Gen2 18650 cell 80 (20% power fade), respectively, after 4-s discharge pulses, as determined by the θ–BV model. Two current conditions are shown (exchange current density and 3 Amps), and eight temperatures are covered.

For FIG. 13, DC discharge pulse data per FIGS. 14A and 14B were used to verify the split between $R_{ct,o}$ and $R_{SEI,2}$ for the two aging conditions represented by cells 14 and 80. The terms of interest in FIGS. 14A and 14B are the "true electrode $R_{ct,o}$" and the difference ($R_{ct}-R_{ct,o}$), which represents the mass transport net impedance term for the SEI. These terms were obtained through the θ–BV kinetics model analysis of pulse data, and the data used here was derived at the exchange current density ($i_o$), which makes the application of θ–BV more relevant to low-current EIS analysis. To demonstrate, from analysis of FIGS. 14A and 14B at the temperature of interest, 30° C., it is determined that between approximately 22 and 56 percent total conductance loss (representing the range between cells 14 and 80), the SEI-based mass transport impedance accounts for about 40% of the change in conductance within this range, subtracting ohmic effects. This change corresponds to an increase of 12% total conductance fade attributable to $R_{SEI,2}$, and yielding an 18% increase attributable to $R_{ct,o}$ over this range of conductance fade. Thus, from DC analysis of the θ–BV model we can surmise the relative split between these fundamental impedance sources and their corresponding affect on cell conductance loss. This split will differ slightly from results obtained from DC charge pulse data (relative to DC discharge pulse data), and the averaging of DC charge and discharge data at the relevant set of (T, SOC, aging) would give the split of terms very close to the truth for AC data represented in FIG. 13. To be remembered is the often unclear comparison between AC and DC-based data, since the AC-based EIS data is a composite between alternating charge and discharge conditions. The comparison can be further complicated when differing ohmic impedances emerge between AC and DC methods due to different test lead configurations, cell connections, cell holders, etc.

Figure 15:
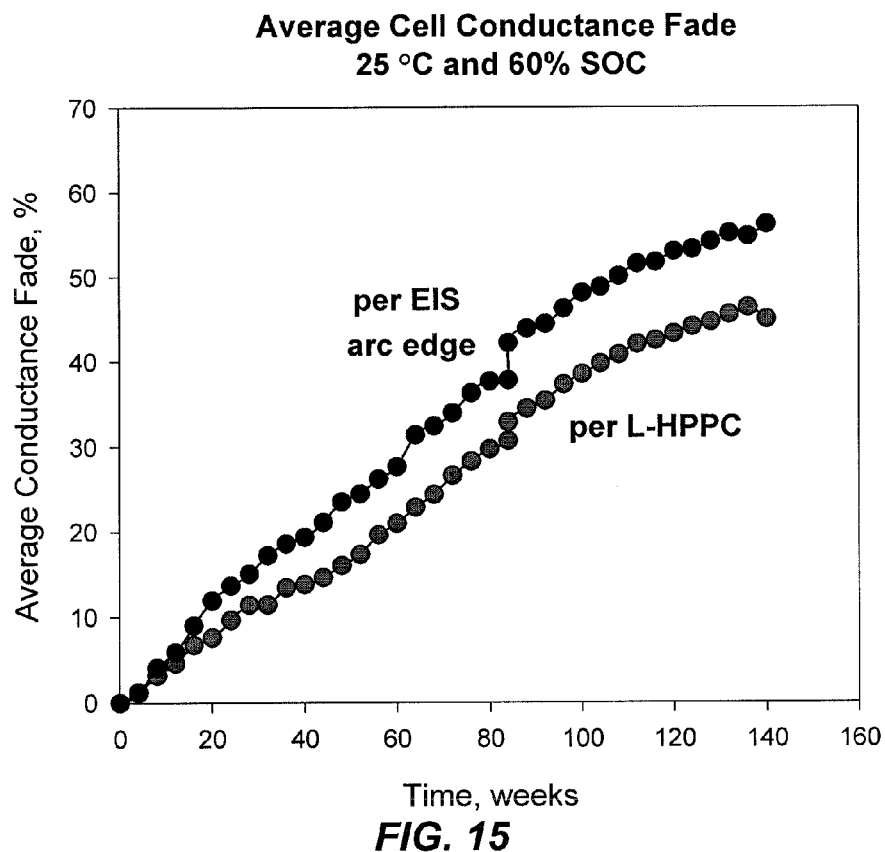
FIG. 15 illustrates average conductance fade based on EIS semicircle RHS edge versus Hybrid Pulse-Power Characterization (HPPC) for electrochemical cells cycle-life tested at 60% SOC and 25° C.

FIG. 15 illustrates average conductance fade based on EIS semicircle RHS edge versus L-HPPC for Gent cells cycle-life tested at 60% SOC and 25° C. MSM results for the HPPC case would be similar to that of EIS data in FIG. 13, showing ohmic and multiple interfacial contributions. It can be seen that AC and DC-based data for conductance loss show very similar trends over time, adding plausibility to a comparative basis.

A final comment is warranted regarding the relative contributions of intrinsic charge transfer impedance ($R_{ct,o}$) and $R_{SEI,net}$ (i.e., $R_{SEI,1}+R_{SEI,2}$) over pulse time (not aging time) in a DC context. From θ–BV model analysis of short pulse data it is evident that the relative percentages of $R_{ct,o}$ and $R_{SEI,net}$ within $R_{ct,eff}$ remain fairly consistent over pulse time. This is significant knowledge since pulses of arbitrary duration can be used to evaluate the split between these essential terms. Using shorter pulses or pulses of convenient duration will enable quicker, more adaptable diagnostic protocol to be employed within battery diagnostic and monitoring devices.

In practice, the DC-based pulse methods disclosed herein are best implemented under controlled conditions whereby temperature and SOC can be maintained within tight tolerances to reference values, or at least minimally variable. This will insure the characterization of performance fade has a consistent basis over the service life of the cells. Characterization should then be reserved for "off-duty" conditions such as when a PHEV or HEV is plugged in or parked at night, and a diagnostic protocol can be fully executed without interference from duty cycle conditions. Finally, it should be stressed that since conventional batteries such as Li-ion are designed to operate in the DC mode, then a DC characterization basis is more relevant and preferred over AC techniques, since a robust DC method will properly account for the polarization effects due to current and also render differences between types of pulsing (constant current vs. constant power) and pulse mode (charge vs. discharge).

8. Power Calculations and Predictions

Cell conductance has a principal and direct influence on attainable power, where both decrease over the life of an electrochemical cell. It has been demonstrated in U.S. patent application Ser. No. 12/765,384 now U.S. Pat. No. 8,346,495, entitled "SYSTEMS, METHODS AND COMPUTER READABLE MEDIA TO MODEL KINETIC PERFORMANCE OF RECHARGEABLE ELECTROCHEMICAL DEVICES" that one of the primary quantities predicted by the θ–BV model is the voltage drop over pulse time, given various aspects of cell conditions (temperature, current, SOC or beginning voltage, state of cell aging, etc.). This capability lends itself to direct calculation of available power, based on the voltage drop. If we maintain constant current conditions then we have power as a function of pulse time:

$$P_{avail.}(t) = I[V_{start} - \Delta V(t) - V_{min}]$$

then $$P_{avail.}(t) = I[V(t) - V_{min}] \quad (29)$$

Alternately, defined through impedance and conductance terms $$P_{avail.}(t) = I(V_{start} - V_{min}) - I^2 \Delta R(t) \quad (30)$$

or $$P_{avail.}(t) = I(V_{start} - V_{min}) - I^2(R_{total}(t) - R_{ohmic})$$
$$\text{ideal basis} \qquad \text{power loss}$$

and then $$P_{avail.}(t) = I(V_{start} - V_{min}) - I^2((\kappa_{cell}(t))^{-1} - (\kappa_{ohmic})^{-1})$$

where $V_{min}$ is the lowest voltage at which energy is available given the cell chemistry and design. Clearly, power will decrease over a constant-current pulse. We see the connection here between the last expression above and the MSM expressions developed earlier involving conductance terms. Thus, if we train MSM parameters to predict conductance loss due to aging at given cell conditions (T, I, $t_{pulse}$, SOC), then we can utilize MSM information to predict power at those conditions.

If a constant power basis is chosen, then current must be varied (increased) over pulse time to satisfy this condition:

$$P_{avail.} = I(t)[V_{start} - \Delta V(t) - V_{min}]$$

then $$P_{avail.} = I(t)[V(t) - V_{min}] \quad (31)$$

Alternately, defined through impedance and conductance terms $$P_{avail.} = I(t)(V_{start} - V_{min}) - I^2(t)\Delta R(t) \quad (32)$$

or $$P_{avail.} = I(t)(V_{start} - V_{min}) - I^2(t)(R_{total}(t) - R_{ohmic})$$
$$\text{ideal basis} \qquad \text{power loss}$$

and then $$P_{avail.} = I(t)(V_{start} - V_{min}) - I^2(t)((\kappa_{cell}(t))^{-1} - (\kappa_{ohmic})^{-1})$$

Achieving constant power pulses involves an iterative scheme whereby the current is adjusted until the product of current and net available voltage is equal to the target power within a given tolerance. With this in mind, the θ–BV model can be incorporated into an iterative scheme for determining voltage drops and current requirements for constant-power pulses. For a given point in pulse time this is done by applying θ–BV as-is on currents progressing under iteration, until equation (31) is satisfied for the target power. This procedure is then repeated over the entire range of pulse time. Such a capability is of significant value to most applications involving relatively high power requirements at well-defined levels, such as vehicle and power tool applications.

However, an equivalent iterative approach using MSM to predict all relevant conductance terms over pulse time is not practical. Yet, we could combine θ–BV and MSM-based expressions for available power to determine $\kappa_{total}(t)$ that could then be used to develop a library of MSM parameters over strategic or reference pulse time values ($t_{ref}$)

$$P_{avail.} = I(t_{ref})[V(t_{ref}) - V_{min}] \stackrel{!}{=} \quad (33)$$
$$I(t_{ref})(V_{start} - V_{min}) - I^2(t_{ref})((\kappa_{total}(t_{ref}))^{-1} - (\kappa_{ohmic})^{-1})$$

which gives $$\kappa_{total}(t_{ref}) = \frac{I^2(t_{ref})}{I(t_{ref})\Delta V(t_{ref}) + I^2(t_{ref})/\kappa_{ohmic}} \quad \text{constant power case}$$

while for constant current operation we have $$\kappa_{total}(t_{ref}) = \frac{I^2}{I\Delta V(t_{ref}) + I^2/\kappa_{ohmic}} \text{ constant current case} \quad (34)$$

If loss of power over cell aging is an important performance metric, then the condition under which power is evaluated should be standardized. This typically involves setting the temperature, SOC, power goal or available energy (or corresponding representative average current for a predetermined minimum pulse duration) and the pulse duration. If we maintain the basis of exchange current density that was adopted for cell conductance, then the reference power could be defined as:

$$P_{avail.}^{ref} = I_o(t_{ref})(V_{start} - V_{min}) - I_o^2(t_{ref})((\kappa_{total}(t_{ref}))^{-1} - (\kappa_{ohmic})^{-1}) \quad (35)$$

where $t_{ref}$ can be any short, application-relevant pulse duration that avoids significant concentration polarization effects. Since both $I_o(t_{ref})$ and $\kappa_{total}(t_{ref})$ can markedly decrease over aging we would expect $P_{avail.}^{ref}$ to reflect a sensitive measure of power loss over cell aging for the critical current region that represents the transition between equilibrium and non-equilibrium conditions. Alternate expressions are also attainable and desirable that address application-specific power and energy goals (e.g., for peak power and continuous power of batteries in hybrid-type vehicles), making it possible to assess power fade over aging with respect to device performance demands.

To summarize, the θ–RV model can be easily adapted to scenarios of constant current or constant power cell operation, and can help train MSM parameters for predicting conductance fade at particular yet arbitrary cell usage conditions. This permits forecasting of achievable power over literally any performance and aging conditions of interest. The interplay between MSM (conductance) and θ–BV models is summarized as follows:

The MSM estimates when a given level of PF will occur along the aging timeline, and by what proportion of constituents. This is to be evaluated at a well-defined reference condition (e.g., exchange current density) that maintains viability throughout the life of the electrochemical cell.

θ–BV gives the exchange current density, various impedance terms, thermodynamic evaluation, etc. over the pulse time domain at the PF value of interest gained from the MSM.

The θ–BV can then be used to train MSM parameters to consider aging trends for arbitrary conditions aside from the reference condition.

Taken together, kinetic performance and available power over the aging timeline is made possible by the predictive framework of the MSM, as related to cell conductance loss. Thus, direct evaluation of power loss or "power fade" over time is an ancillary benefit of the modeling method.

Therefore, if the θ–BV model is coupled with the MSM to establish cell aging over time (performance fade with respect to cell conductance), then it could be determined at what point in aging time a cell would no longer be able to deliver the requested power. This capability has direct application to warranty issues and predicting when batteries should either be removed from primary service and placed in a secondary role (e.g., vehicle-to-grid), or constrained to operate only under lower-power conditions. This will enhance battery management and safety since cells no longer able to meet power goals will not be pushed into conditions that could result in failure in terms of total loss of performance or thermal runaway.

Since electrochemical cell power is a distinct performance measure that diminishes over time, then the MSM approach can be applied to track and predict the fractional power loss:

$$\begin{bmatrix} \text{Power loss} \\ \text{over aging} \end{bmatrix} = \left(\frac{P_{(t_o)} - P_{(t)}}{P_{(t_o)}}\right) = \sum_{i=1}^{n}\left[2P_{ref,i}\left(\frac{1}{2} - \frac{1}{1 + \exp\{a_i t^{b_i}\}}\right)\right] \quad (36)$$

where the parameters and symbols have their usual meanings. Note that this expression (and hence, the parameters) is particular to both the aging conditions and the definition of the power target.

Figure 16:
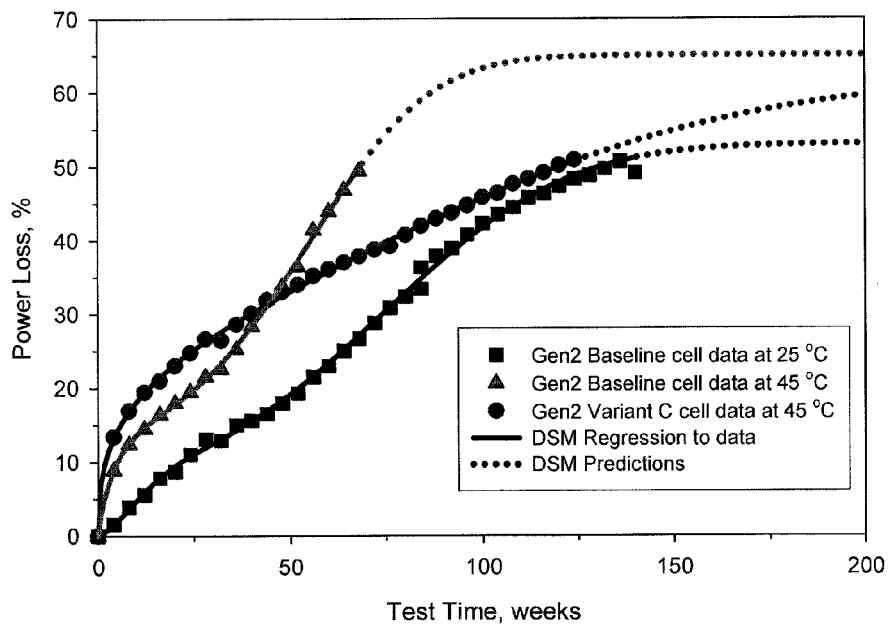
FIG. 16 illustrates power fade data and Multiple Sigmoid Model (MSM) modeling results (here double-sigmoid model, DSM) for various Gen2 lithium-ion cells tested at 25° C. and 45° C. under cycle-life conditions at 60% SOC.

FIG. 16 illustrates an example of using the MSM expression above for power loss, wherein power fade data (symbols) are shown for the same general type of lithium-ion cells mentioned previously (Gen2 and its variations) that were aged under cycle-life conditions defined by a scaled 25 Watt-hour power-assist cycling profile, and at two temperatures. In this case the MSM evaluation involved two sigmoidal contributions to power fade, hence a double-sigmoid model (DSM) produced the renderings of power fade trends. The test data was used to train the DSM parameters, and the predictive power of the DSM is seen after 68, 124, or 140 weeks, depending on the test group. Excellent regressive and predictive capabilities are seen, e.g., the modeling approach accurately estimates subtle changes in power loss rates as well as the occurrence of the power loss plateau at around 53 percent for the 25° C. Baseline cells, but no such plateau as of 200 weeks for the 45° C. Variant C cells. The 45° C. Baseline cells were not tested past 68 weeks, although their long-term predictions are given. The maximum power fade limit for both groups of cells aged at 45° C. was determined to be around 65 percent, based on DSM regression. Overall, these results are encouraging toward developing an advanced modeling capability that predicts long-term performance once the model parameters have been sufficiently trained.

Although we should expect the same aging mechanisms shown in FIG. 13 to influence power losses in FIG. 16 (since the data trends are very similar), the DSM was used for this example in order to show the utility of the MSM in one of its simpler forms. In general terms, for the DSM used here the first sigmoid corresponds to curve B in FIG. 13 while the second sigmoid covers the collective contributions of curves A, C, and D. More sigmoid terms could be included to elucidate more detail of aging mechanisms (as in FIG. 13), but that level of evaluation might not always be needed for assessing and predicting performance trends of cell power.

In practice, the MSM approach would be applied to short-term predictions of conductance and power loss (say, a month past the most recent data) yielding high confidence predictions, while also performing long-term predictions (several months past data) to provide more qualitative trends for the aging behavior.

9. Summary

The exchange current density ($i_o$) is an appropriate universal quantity whereby to base cell conductance considerations over arbitrary cell aging, SOC, and temperature. Since exchange current density ($i_o$) will vary over DC pulse time and can vary between charge and discharge conditions, exchange current density ($i_o$) should be referenced to the conditions under which it was obtained. Low-current DC pulses in the vicinity of exchange current density ($i_o$) can and should be used to assess cell conductance over aging, quantifying "performance fade," denoted PF(t). [See equation (3)].

A three-point method has been devised to ascertain exchange current density ($i_o$) at zero and increasing cell aging, and interpolate/extrapolate related impedance terms at arbitrary currents. [See FIG. 8, equations (24) and (25)].

The θ–BV/GERE model can be used to regress ohmic-corrected DC pulse data upfront or at any aging time to validate values of exchange current density ($i_o$) and effective electrode surface availability ($\theta_{eff}$), then can be used in an updateable prediction scheme to determine cell impedance at any current for a target pulse duration, given the cell SOC and temperature. [See equations (17)-(23)]. In addition, the θ–BV/GERE model based on ohmic-corrected DC pulse data can be used to determine the various cell impedance contributions over pulse duration, such as $R_{ohmic}$, $R_{ct,o}$, and $R_{int,DC}$, given the cell SOC and temperature. [See equations (17)-(23)].

A generalized Multiple Sigmoid Model (MSM) can regress cell performance fade (PF) data over time, demonstrating extreme accuracy and robustness, and can be used to surmise rate or kinetic parameters such as rate constants and orders of reaction. [See equation (7)]. The MSM can be used in combination with the θ–BV/GERE model to elucidate specific contributions to cell PF over time, yielding related kinetic parameters for the individual mechanisms. [See FIG. 13 and equations (8)-(16)]. The MSM is equally applicable to conductance data from EIS-based analyses and conductance fade data from DC pulse data such as that derived from hybrid pulse-power characterization (HPPC) testing, and power fade data, making it amenable to common performance data.

The MSM acts to directly link the growth of impedance sources to their respective conductance fade rates, enabling diagnosis of failure mechanisms and providing a basis toward mitigating technology weaknesses or limitations. [See FIG. 13 and equations (8)-(16)]. The MSM can be used to support a predictive PF scheme once the data is sufficiently mature in its trending. The θ–BV/GERE model can provide guidance to the MSM in estimating parameter values for $PF_{ref,i}$.

A method based on SQRT(1/frequency) has been shown to render low-current DC discharge pulse impedances very close to those obtained under AC-based EIS measurements over temperature, looking at the frequency at the RHS edge of the main semicircle region in Nyquist plots over cell aging. Thus, intelligently designed DC pulses can act as surrogate measures for expensive and time-consuming AC techniques, and can provide supporting information to construct essential elements of complex impedance spectra. [See FIG. 10 and FIG. 12]. Aging effects for a predictive PF scheme can be assessed by Arrhenius-type behavior. [See FIG. 11].

$R_{ohmic}$ is easily derived by extrapolating $R_{total}$ from pulse data back to time zero. Performance fade at any "short" pulse condition (generally ≦20 seconds for low to moderate currents, ≦10 seconds for higher currents) for any arbitrary current can be determined, including cases typically ascribed to hybrid-pulse power characterization (HPPC) conditions. Temperature compensation of significant parameters can be accomplished at least in part by employing Arrhenius-type relations, allowing a consistent temperature basis (e.g., 30° C.) by which to evaluate PF.

The generalized MSM architecture is amenable to evaluating power fade of electrochemical cells. Conductance fade can be used as the basis for determining MSM parameters for power fade at an applicable power target, or power loss data can be used to train the MSM parameters.

Thus, embodiments of the present invention provide a self-consistent method to define, measure, evaluate, track and predict conductance fade (denoted performance fade (PF)) and related quantities such as power fade based on DC pulse techniques and novel modeling tools. Such a capability would prove invaluable in applications ranging from post facto data analysis to dynamic real-time cell diagnostic protocol in application such as hybrid electric vehicles (HEVs), plug-in hybrid electric vehicles (PHEVs), and electric vehicles (EVs), and a host of other consumer electronics and defense applications. Since most electrochemical cells are designed to operate in a DC mode within their intended application, then a DC-based diagnostic scheme may be preferred over AC techniques for logistical, technical, and economic reasons.

Although this invention has been described with reference to particular embodiments, the invention is not limited to these described embodiments. Rather, the invention is encompassed by the appended claims and their legal equivalents.

What is claimed is:

1. A method wherein at least one act of the method is performed by a processor, the method comprising:
developing a mechanistic level model of an electrochemical cell to determine performance fade characteristics of the electrochemical cell using:
first constant-current pulses applied to the electrochemical cell at a first aging period and at three or more current values bracketing a first exchange current density; and
second constant-current pulses applied to the electrochemical cell at a second aging period and at three or more current values bracketing a second exchange current density; and
analyzing the mechanistic level model to estimate performance fade characteristics over aging of a similar electrochemical cell.

2. The method of claim 1, wherein the performance fade characteristics comprise conductance fade.

3. The method of claim 1, wherein analyzing the mechanistic level model includes estimating for the similar electrochemical cell one or more of exchange current density, intrinsic charge transfer impedance, ohmic impedance, interfacial impedance contribution, total impedance, and electrode surface availability.

4. The method of claim 1, wherein:
the first constant-current pulses comprise current values of about one-half, two times, and four times the first exchange current density; and
the second constant-current pulses comprise current values of about one-half, two times, and four times the second exchange current density.

5. The method of claim 1, further comprising using a modified Butler-Volmer (BV) expression on ohmic-corrected data to determine the first exchange current density.

6. The method of claim 1, further comprising including a rate expression comprising a multiple sigmoid model in the mechanistic level model to predict future performance fade as a function of future time.

7. The method of claim 1, further comprising including a modified BV expression in the mechanistic level model to predict the performance fade characteristics at constant-current pulses different from the first constant-current pulses and the second constant-current pulses.

8. The method of claim 7, further comprising including a rate expression comprising a multiple sigmoid model in the mechanistic level model to predict future performance fade as a function of future time.

9. The method of claim 7, further comprising including a rate expression comprising a multiple sigmoid model in the mechanistic level model to predict future power characteristics using future conductance loss characteristics as a function of future time.

10. The method of claim 1, further comprising using constant-current pulses that emulate alternating current techniques for impedance determination by using pulse durations of the constant-current pulses corresponding to the inverse-square-root of frequency of the alternating current techniques.

11. A method wherein at least one act of the method is performed by a processor, the method comprising:
developing a mechanistic level model of an electrochemical cell to determine performance fade characteristics of the electrochemical cell using: first constant-power pulses applied to the electrochemical cell at a first aging period and at three or more current values bracketing a first exchange current density; and second constant-power pulses applied to the electrochemical cell at a second aging period and at three or more current values bracketing a second exchange current density; and analyzing the mechanistic level model to estimate performance fade characteristics over aging of a similar electrochemical cell.

12. The method of claim 11, wherein the first constant-power pulses and the second constant-power pulses are determined iteratively by adjusting constant current pulses until the product of current and available voltage is within a predetermined tolerance of a first target power and a second target power, respectively.

13. A method wherein at least one act of the method is performed by a processor, the method comprising: developing a mechanistic level model of an electrochemical cell to determine performance fade characteristics of the electrochemical cell using: first constant-current pulses applied to the electrochemical cell at a first aging period and at three or more current values bracketing a first exchange current density; and second constant-current pulses applied to the electrochemical cell at a second aging period and at three or more current values bracketing a second exchange current density; analyzing the mechanistic level model to estimate performance fade characteristics over aging of a similar electrochemical cell; and modifying at least one of a discharge process for, a charge process for, and composition of, the electrochemical cell responsive to the analyzing the mechanistic level model.

14. The method of claim 13, wherein the performance fade characteristics comprise conductance fade.

15. The method of claim 13, wherein analyzing the mechanistic level model includes estimating for the similar electrochemical cell one or more of exchange current density, intrinsic charge transfer impedance, ohmic impedance, interfacial impedance contribution, total impedance, and electrode surface availability.

16. The method of claim 13, wherein:
the first constant-current pulses comprise current values of about one-half, two times, and four times the first exchange current density; and
the second constant-current pulses comprise current values of about one-half, two times, and four times the second exchange current density.

17. The method of claim 13, further comprising using a modified BV expression on ohmic-corrected data to determine the first exchange current density.

18. The method of claim 13, further comprising including a rate expression comprising a multiple sigmoid model in the mechanistic level model to predict future performance fade as a function of future time.

19. The method of claim 13, further comprising including a modified BV expression in the mechanistic level model to predict the performance fade characteristics at constant-current pulses different from the first constant-current pulses and the second constant-current pulses.

20. The method of claim 19, further comprising including a rate expression comprising a multiple sigmoid model in the mechanistic level model to predict future performance fade as a function of future time.

21. The method of claim 19, further comprising including a rate expression comprising a multiple sigmoid model in the mechanistic level model to predict future power characteristics using future conductance loss characteristics as a function of future time.

22. The method of claim 13, further comprising using constant-current pulses that emulate alternating current techniques for impedance determination by using pulse durations of the constant-current pulses corresponding to the inverse-square-root of frequency of the alternating current techniques.

23. A system, comprising: an electrochemical cell; monitoring hardware operably coupled to the electrochemical cell and configured for sampling cell characteristics of the electrochemical cell; and a computing system operably coupled to the monitoring hardware and configured for: developing a mechanistic level model of an electrochemical cell to determine performance fade characteristics of the electrochemical cell using the sampled cell characteristics for: first constant-current pulses applied to the electrochemical cell at a first aging period and at three or more current values bracketing a first exchange current density; and second constant-current pulses applied to the electrochemical cell at a second aging period and at three or more current values bracketing a second exchange current density; and analyzing the mechanistic level model to estimate performance fade characteristics over aging of a similar electrochemical cell.

24. The system of claim 23, wherein the computing system comprises a memory for storing computing instructions and a processor operably coupled to the memory and configured for executing the computing instructions to carry out the acts of developing a mechanistic level model and analyzing the mechanistic level model.

25. The system of claim 23, wherein the computing system is further configured for providing:
the first constant-current pulses with current values of about one-half, two times, and four times the first exchange current density; and
the second constant-current pulses with current values of about one-half, two times, and four times the second exchange current density.

26. The system of claim 23, wherein the computing system is further configured for including a rate expression comprising a multiple sigmoid model in the mechanistic level model to predict future performance fade as a function of future time.

27. The system of claim 23, wherein the computing system is further configured for including a modified BV expression in the mechanistic level model to predict the performance fade characteristics at constant-current pulses different from the first constant-current pulses and the second constant-current pulses.

28. The system of claim 27, wherein the computing system is further configured for including a rate expression comprising a multiple sigmoid model in the mechanistic level model to predict future power characteristics using future conductance loss characteristics as a function of future time.

29. The system of claim 23, wherein the computing system is further configured for using constant-current pulses that emulate alternating current techniques for impedance determination by using pulse durations of the constant-current pulses corresponding to the inverse-square-root of frequency of the alternating current techniques.

30. A non-transitory computer-readable medium including computer-executable instructions, which when executed on one or more processors, perform the acts comprising: developing a mechanistic level model of an electrochemical cell to determine performance fade characteristics of the electrochemical cell using: first constant-current pulses applied to the electrochemical cell at a first aging period and at three or more current values bracketing a first exchange current density; and second constant-current pulses applied to the electrochemical cell at a second aging period and at three or more current values bracketing a second exchange current density; and analyzing the mechanistic level model to estimate performance fade characteristics over aging of a similar electrochemical cell.

31. The non-transitory computer-readable medium of claim 30, further comprising computer-executable instructions for instructing a charge circuit to provide:

the first constant-current pulses with current values of about one-half, two times, and four times the first exchange current density; and the second constant-current pulses with current values of about one-half, two times, and four times the second exchange current density.

32. The non-transitory computer-readable medium of claim 30, further comprising computer-executable instructions for including a rate expression comprising a multiple sigmoid model in the mechanistic level model to predict future performance fade as a function of future time.

33. The non-transitory computer-readable medium of claim 30, further comprising computer-executable instructions for including a modified BV expression in the mechanistic level model to predict the performance fade characteristics at constant-current pulses different from the first constant-current pulses and the second constant-current pulses.

34. The non-transitory computer-readable medium of claim 33, further comprising computer-executable instructions for including a rate expression comprising a multiple sigmoid model in the mechanistic level model to predict future power characteristics using future conductance loss characteristics as a function of future time.

35. The non-transitory computer-readable medium of claim 30, further comprising computer-executable instructions for using constant-current pulses that emulate alternating current techniques for impedance determination by using pulse durations of the constant-current pulses corresponding to the inverse-square-root of frequency of the alternating current techniques.

* * * * *